(12) United States Patent
Giuroiu

(10) Patent No.: US 6,466,090 B1
(45) Date of Patent: Oct. 15, 2002

(54) DIGITALLY PROGRAMMABLE CONTINUOUS-TIME MODULES FOR SIGNAL PROCESSING

(75) Inventor: Horia Giuroiu, Campbell, CA (US)

(73) Assignee: Oki America, Inc., Sunnyvale, CA (US)

( * ) Notice: Subject to any disclaimer, the term of this patent is extended or adjusted under 35 U.S.C. 154(b) by 57 days.

(21) Appl. No.: 09/705,790

(22) Filed: Nov. 6, 2000

(51) Int. Cl.⁷ .................................................. H03F 1/36
(52) U.S. Cl. ............................ 330/86; 330/69; 327/552
(58) Field of Search .............................. 330/69, 85, 86, 330/282, 310, 311; 327/552

(56) References Cited

U.S. PATENT DOCUMENTS

| | | | |
|---|---|---|---|
| 5,218,320 A | * 6/1993 | Albouy et al. | 330/259 |
| 5,530,399 A | 6/1996 | Chambers et al. | 327/561 |
| 5,666,083 A | 9/1997 | Myers et al. | 327/553 |
| 5,666,086 A | 9/1997 | Klein | 330/253 |
| 5,666,087 A | * 9/1997 | Gorecki | 330/260 |
| 5,912,583 A | * 6/1999 | Pierson et al. | 327/553 |

OTHER PUBLICATIONS

Geiger et al, R.L., "A reconfigurable biquadratic building block for digitally–controlled continuous–time signal processing," Government Microcircuit Application Conference (GOMAC), pp. 157–160, Oct. 1987.

Geiger et al, Randall L., "Active filter design using operational transconductance amplifiers: A tutorial," IEEE Circuits and Devices Magazine, vol. 1, pp. 20–32, Mar. 1985.

Krummenacher et al., Francois, "A 4–MHz CMOS Continuous–Time Filter with On–Chip Automatic Tuning," IEEE Journal of Solid–State Circuits, vol. 23, pp. 750–758, Jun. 1988.

Kwan et al., Tom, "An Adaptive Analog Continuous–Time CMOS Biquardratic Filter," IEEE Journal of Solid–State Circuits, vol. 26, pp. 859–867, Jun. 1991.

Silva–Martinez et al., Jose, "IC Voltage to Current Transducers with Very Small Transconductance," Analog Integrated Circuits and Signal Processing, vol. 13, pp. 283–293, No. 3, Jul. 1997.

* cited by examiner

Primary Examiner—Robert Pascal
Assistant Examiner—Henry Choe
(74) Attorney, Agent, or Firm—Volentine Francos, PLLC

(57) ABSTRACT

An amplifier is provided The amplifier includes an input voltage-to-current converter, a programmable input current divider, a current follower, a feedback voltage-to-current converter, and a programmable feedback current divider. The input voltage-to-current converter receives an input voltage and provides upper and lower input currents. The input current divider receives a first bias voltage and the upper and lower input currents, scales the upper and lower input currents, and provides upper and lower scaled input currents. The current follower receives the upper and lower scaled input currents, and provides upper and lower output currents and an output voltage. The feedback voltage-to-current converter receives the output voltage and provides upper and lower feedback currents. And the feedback current divider receives a second bias voltage and the upper and lower feedback currents, scales the upper and lower feedback currents, and provides upper and lower scaled feedback currents to the current follower.

6 Claims, 22 Drawing Sheets

DIGITALLY PROGRAMMABLE CONTINUOUS-TIME MODULES FOR SIGNAL PROCESSING

BACKGROUND OF THE INVENTION

The present invention relates to transconductor-based programmable gain amplifiers and programmable continuous-time filters. More particularly, the present invention relates to methods of building transconductor-based programmable gain amplifiers and programmable continuous-time filters.

The main parameters of transconductor-based programmable gain amplifiers and programmable continuous-time filters (i.e., in-band gain, cut-off frequency, and quality factor) usually depend on transconductances or ratios of transconductances. The usual methods of changing these parameters are either changing the value of the transconductances (in amplifiers or filters), or changing the value of the capacitors involved (in filters).

A conventional transconductor-transconductor ($g_m$-$g_m$) voltage amplifier is presented in FIG. 1. The $g_m$-$g_m$ voltage amplifier 100 includes an input transconductor 110, a feedback transconductor 120, and a current-follower, such as a folded cascode 130.

The output currents of the input transconductor 110 and of the feedback transconductor 120 are summed at the inputs the folded-cascode 130. The feedback transconductor 120 establishes a negative feedback across the folded-cascode 130.

The operation of the amplifier is described by the following equations:

$$i_{inp} = g_{mi} \frac{v_{ip} - v_{im}}{2} \quad (1)$$

$$i_{inm} = -g_{mi} \frac{v_{ip} - v_{im}}{2} \quad (2)$$

$$i_{fbp} = g_{mf} \frac{v_{om} - v_{op}}{2} \quad (3)$$

$$i_{fbm} = -g_{mf} \frac{v_{om} - v_{op}}{2} \quad (4)$$

where $g_{mi}$ is the transconductance of the input transconductor 110 and $g_{mf}$ is the transconductance of the feedback transconductor 120, At equilibrium $$i_{inp} = -i_{fpb}$$

$$i_{inm} = -i_{fbm} \quad (5, 6)$$

As a result, the voltage gain $A_v$ is determined as follows:

$$A_v = \frac{v_{difo}}{v_{difi}} = -\frac{g_{mi}}{g_{mf}}, \quad (7)$$

where $$v_{difo} = v_{op} - v_{om};$$

$$v_{difi} = v_{ip} - v_{im}. \quad (8, 9)$$

In order to make the voltage gain $A_v$ programmable, at least one of the transconductances $g_{mi}$, $g_{mf}$ must be programmable.

Active $G_m$-C filters make use of integrators composed of transconductors, such as OTAs (Operational Transconductance Amplifiers), and capacitors. One particular structure of a cascode/folded-cascode $G_m$-C based biquad filter is presented in FIG. 2.

The $G_m$-C based biquad filter 200 shown in FIG. 2 includes first and second input transconductors 210 and 220, first and second feedback transconductors 230 and 240, first and second current-followers (folded-cascodes) 250 and 260, and first and second capacitors $C_1$ and $C_2$. The first through fourth transconductors 210, 220, 230, and 240, have transconductances of $g_{m1}$, $g_{m2}$, $g_{m3}$, $g_{m4}$, respectively. The transfer function from ($i_p$, $i_m$) to ($o_{p2}$, $o_{m2}$) is:

$$T_2(s) = \frac{V(op2) - V(om2)}{V(ip) - V(im)} = \frac{g_{m1} \times g_{m2}}{C_1 \times C_2 \times s^2 + g_{m3} \times C_2 \times s + g_{m2} \times g_{m4}} \quad (10)$$

This is a transfer function corresponding to a second-order low-pass filter with the cut-off frequency of:

$$\omega_0 = \sqrt{\frac{g_{m2} \times g_{m4}}{C_1 \times C_2}} \quad (11)$$

with a quality factor:

$$Q = \sqrt{\frac{g_{m2} \times g_{m4}}{g_{m3}^2}} \times \sqrt{\frac{C_1}{C_2}} \quad (12)$$

and a DC gain:

$$T_2(0) = \frac{g_{m1}}{g_{m4}} \quad (13)$$

When the individual transconductances $g_{mk}$ are each considered as a multiple of an elementary transconductance $g_m$:

$$g_{mk} = a_k \times g_m, (k=1, \ldots, 4) \quad (14)$$

the parameters of the filter become:

$$\omega_0 = \sqrt{a_2 \times a_4} \times \frac{g_m}{\sqrt{C_1 \times C_2}} \quad (15)$$

$$Q = \sqrt{\frac{a_2 \times a_4}{a_3^2}} \times \sqrt{\frac{C_1}{C_2}} \quad (16)$$

$$T_2(0) = \frac{a_1}{a_4} \quad (17)$$

Thus, in order to change the parameters of the filter one has to adjust the values of the capacitances and/or the transconductances.

A generic transconductor is presented in FIG. 3. The output current of the transconductor 300 is proportional to the differential input voltage:

$$i_o = g_m = v_{in} \quad (18)$$

A conventional implementation of the transconductor 300 is shown in FIG. 4. The transconductor 300 includes first and second differential transistors $T_{D1}$ and $T_{D2}$, first and second mirror transistors $T_{M1}$ and $T_{M2}$, and a current source 410. The current source 410 provides a current $I_q$. The first and second mirror transistors $T_{M1}$ and $T_{M2}$ form a current mirror 420. The first and second differential transistors $T_{D1}$ and $T_{D2}$ form a differential pair 430, biased by the current source 410 and the current mirror 420. The transconductance of this stage depends on the bias current $I_q$:

$$i_{out} = g_m(I_q) \times v_{in} = \sqrt{2 \times K_n' \times I_q \times \left(\frac{W}{L}\right)_1} \times v_{in} \quad (19)$$

where $(W/L)_1$ is the aspect ratio of the first and second differential transistors $T_{D1}$ and $T_{D2}$ of the differential pair 430, and $K_n'$ is the transconductance parameter for the same transistors.

One conventional way of adjusting the transconductance is by changing the bias current $I_q$. This can be done continuously or in steps. The circuit of FIG. 4 performs the adjustment continually.

However, FIG. 5 shows a transconductor similar to the circuit of FIG. 4, except that the bias current is adjusted in steps. As shown in FIG. 5, the transconductor 500 includes first and second differential transistors $T_{D1}$ and $T_{D2}$, first and second mirror transistors $T_{M1}$ and $T_{M2}$, and a current source 510. As in FIG. 4, the first and second mirror transistors $T_{M1}$ and $T_{M2}$ form a current mirror 420, and the first and second differential transistors $T_{D1}$ and $T_{D2}$ form a differential pair 430, biased by the current source $I_q$ and the current mirror 510. However, the current source 510 further includes first through $n^{th}$ bias sources $550_1, 550_2, \ldots, 550_n$, for supplying first through $n^{th}$ bias currents $I_{q1}, \ldots, I_{qn}$, which can be coupled to the differential pair 430 through first through $n^{th}$ switches $560_1, 560_2, \ldots, 560_n$, respectively. In this case the transconductance can be programmed through the digital word $D=(D_1, \ldots, D_n)$, respectively used to control the first through $n^{th}$ switches $560_1, 560_2, \ldots, 560_n$, respectively.

The main disadvantage of the circuits of FIGS. 4 and 5 is that changing the bias current affects not only the transconductance, but the operating point and the input voltage range (for a given amount of distortions).

As a result, another way of setting the transconductance of a differential stage has been proposed, which is shown in FIG. 6. The transconductor 600 of FIG. 6 includes first and second differential transistors $T_{D1}$ and $T_{D2}$, first and second mirror transistors $T_{M1}$ and $T_{M2}$, first and second current sources 610a and 610b, and a resistor $R_s$.

The first and second current sources 610a and 610b each provide a current $I_q$. The first and second mirror transistors $T_{M1}$ and $T_{M2}$ form a current mirror 420. The first and second differential transistors $T_{D1}$ and $T_{D2}$ form a differential pair 430, and are biased respectively by the first and second current sources 610a and 610b and the current mirror 420. The resistor $R_s$ is placed between the first and second current sources 610a and 610b.

If the transconductance of the differential pair transistor is much larger than the conductance of the degeneration resistor $R_s$:

$$g_m \gg \frac{1}{R_s}, \quad (20)$$

then the output current is given by:

$$i_{out} = \frac{2 \times v_{in}}{R_s} \quad (21)$$

The gain of the circuit can be adjusted through the size of the resistor $R_s$. The operating point of the circuit does not change with $R_s$, but usually the transconductance of the first and second mirror transistors $T_{M1}$ and $T_{M2}$ has to be enhanced in order to fulfil condition (20).

The resistance $R_s$ can be adjusted continuously or in steps. When it is adjusted in discrete steps, the resistor $R_s$ is replaced by a network including resistors and switches placed in parallel or in series with these resistors. The switches contribute with important parasitic resistance and capacitance to the equivalent circuit of $R_s$, affecting the transfer function of the stage.

Another way of adjusting the transconductance is presented in FIG. 7, which shows a conventional continuously-variable transconductor with output current steering. This circuit 700 includes first and second current sources 710a and 710b, a current mirror 720, a source degenerated transconductance stage 725, and a folded-cascode configuration 735.

The first and second current sources 715a and 715b supply currents $I_{f1}$ and $I_{f2}$, respectively, which are identical. The current mirror 720 includes first and second mirror transistors $T_{M1}$ and $T_{M2}$.

The source degenerated transconductance stage 725 includes second and third current sources 710a and 710b, a degeneration resistor $R_s$, and first and second differential transistors $T_{D1}$ and $T_{D2}$.

The folded-cascode configuration 735 includes first through fourth folded-cascode transistors, $T_{FC1}$, $T_{FC2}$, $T_{FC3}$, and $T_{FC4}$, arranged in two current steering stages ($T_{FC1}$ and $T_{FC2}$; $T_{FC3}$ and $T_{FC4}$), each controlled by the same voltage $V_{tune}$. The current steering stages are biased by the currents $I_{f1}$, $I_{f2}$ supplied by the first and second current sources 715a and 715b, respectively.

The current is output through the current mirror 720 as an output current $i_{out}$. The transconductance of the differential stage made by the first and second differential transistors $T_{D1}$ and $T_{D2}$ is now constant, set by the degeneration resistor $R_s$, and by the transconductance of the differential pair $T_{D1}$ and $T_{D2}$.

The output current $i_{out}$ is only a fraction of the differential stage output because of the current steering. By changing the tuning voltage $V_{tune}$, the amount of the differential stage current that will reach the output will vary.

As a result, the transconductance of the whole stage is tunable, but the amount of DC current flowing into the first and second mirror transistors $T_{M1}$, $T_{M2}$ and the voltage on the first and second current sources 715a and 715b is also dependent on the tuning voltage $V_{tune}$, leading to current transmission errors.

Another way of programming the transconductor is by multiplying the output current of a voltage-to-current converter through multiple, digitally-selected current mirrors. One way to build programmable transconductor-transconductor ($g_m$-$g_m$) amplifiers and $G_m$-C filters is to build all the transconductances as multiples of a unit transconductance.

This approach is then implemented by having all of the transconductors that are used being multiples of the same uniform transconductor, as shown in FIG. 8. This circuit 800 includes a plurality of transconductors $850_1, 850_2, \ldots, 850_n$, and a plurality of switches $860_1, 860_2, \ldots, 860_n$. The switches $860_1, 860_2, \ldots, 860_n$, are controlled by a plurality of data bits $D_1, D_2, \ldots, D_n$.

Such a structure can be programmed in steps by switching ON and OFF a certain number of transconductors by opening and closing certain of the switches $860_1, 860_2, \ldots, 860_n$. The output current then depends on the number of transconductors selected.

Another way of programming the transconductance is by switching off the transistors of the unselected transconductors. The input dynamic range is not affected by the number of transconductors selected. This kind of programming, albeit easily done, is space consuming on an integrated circuit and difficult to route and connect.

It is therefore desirable to provide a design that overcomes these problems.

SUMMARY OF THE INVENTION

It is thus an object of the present invention to overcome or at least minimize the various drawbacks associated with conventional transconductors used to convert an input voltage into a desired output current The present invention proposes structures based on transconductors with digitally programmable transconductance and substantially constant DC operating points, using resistive dividers.

It is another object of this invention to propose merged programmable amplifiers and filters using substantially identical digitally-programmable transconductors with resistive dividers.

It is yet another object of this invention to propose a method of compensating the offset of merged programmable amplifiers and filters using digitally-programmable transconductors with resistive dividers.

It is yet another object of this invention to propose a method of realizing low frequency continuous-time filters by using small size high-transconductance stages with resistive current dividers at the output.

An amplifier is provided to achieve these objectives. The amplifier, includes an input voltage-to-current converter for receiving an input voltage and providing upper and lower input currents; an input current divider for receiving a first bias voltage and the upper and lower input currents, scaling the upper and lower input currents, and providing upper and lower scaled input current; a current follower for receiving the upper and lower scaled input current, and for providing upper and lower output currents and an output voltage; a feedback voltage-to-current converter for receiving the output voltage and providing tipper and lower feedback currents; and a feedback current divider for receiving a second bias voltage and the upper and lower feedback currents, scaling the upper and lower feedback currents, and providing upper and lower scaled feedback currents to the current follower.

The amplifier may further include a voltage follower for providing the first and second bias voltages. The first and second bias voltages are preferably substantially the same, and are preferably equal to a current follower DC input voltage.

The input current divider and the feedback current divider are both preferably programmable.

Another kind of amplifier may also be provided to achieve these objectives. This amplifier includes an input voltage-to-current converter for receiving an input voltage and providing upper and lower input currents; a programmable resistor network for receiving a first bias voltage and the upper and lower input currents, scaling the upper and lower input current, and providing upper and lower scaled input currents; a current follower for receiving the upper and lower scaled input currents, and for providing upper and lower output currents and an output voltage; and a feedback voltage-to-current converter for receiving the output voltage and providing upper and lower feedback currents to the programmable resistor network.

The programmable resistor network may itself comprise first through $n^{th}$ upper resistors connected in series; first through $n^{th}$ upper input switches, each upper input switch being connected between the upper input current and a first end of a respective upper resistor; a $0^{th}$ upper input switch connected between the upper input current and a second end of the first upper resistor; first through $n^{th}$ upper feedback switches, each upper feedback switch being connected between the upper feedback current and the first end of a respective upper resistor; first through $n^{th}$ lower resistors connected in series; first through $n^{th}$ lower input switches, each lower input switch being connected between the lower input current and a first end of a respective lower resistor; a $0^{th}$ lower input switch connected between the lower input current and a second end of the first lower resistor; and first through $n^{th}$ lower feedback switches, each lower feedback switch being connected between the lower feedback current and the first end of a respective lower resistor. The upper scaled input current is preferably provided at the first end of the $n^{th}$ upper resistor; the lower scaled input current is preferably provided at the first end of the $n^{th}$ lower resistor; and n is preferably a whole number greater than one.

Preferably only one of the upper input switches is closed at a given time, only one of the upper feedback switches is closed at a given time, only one of the lower input switches is closed at a given time, and only one of the lower feedback switches is closed at a given time.

The amplifier may further include a voltage follower for providing a first bias voltage to the second end of the first upper resistor and to the second end of the first lower resistor. The first bias voltage is preferably equal to a current follower DC input voltage.

The upper and lower resistors are preferably of substantially the same value. The programmable resistor network can also be an R-kR resistor network.

The R-kR resistor network may comprise first through $(n-2)^{th}$ upper base resistors connected in series; a $0^{th}$ upper k-factored resistor connected between the first bias voltage and a first end of the first upper base resistor; first through $(n-1)^{th}$ upper k-factored resistors, each upper k-factored resistor being connected between a first bias voltage and a first end of a respective upper base resistor; an $n^{th}$ upper k-factored resistor connected between a first bias voltage and a second end of the $(n-2)^{th}$ upper base resistor; an $(n+1)^{th}$ upper k-factored resistor connected between the second end of the $(n-1)^{th}$ upper base resistor and the upper scaled input current; a $0^{th}$ upper input switch connected between the upper input current and the first bias voltage; first through $(n-2)^{th}$ upper input switches, each upper input switch being connected between the upper input current and the first end of respective first upper base resistors; an $(n-1)^{th}$ upper input switches connected between the upper input current and the second end of the $(n-2)^{th}$ upper base resistor; an $n^{th}$ upper input switch connected between the upper input current and the first scaled input current; first through $(n-2)^{th}$ upper feedback switches, each upper feedback switch being connected between the upper feedback current and the first end of a respective upper base resistor; an $(n-1)^{th}$ upper feedback switch connected between the upper feedback current and the second end of the $(n-2)^{th}$ upper base resistor; first through $(n-2)^{th}$ lower base resistors connected in series; a $0^{th}$ lower k-factored resistor connected between the first bias voltage and a first end of the first lower base resistor; first through $(n-1)^{th}$ lower k-factored resistors, each lower k-factored resistor being connected between a first bias voltage and a first end of a respective lower base resistor; an $n^{th}$ lower k-factored resistor connected between a first bias voltage and a second end of the $(n-2)^{th}$ lower base resistor; an $(n+1)^{th}$ lower k-factored resistor connected between the second end of the $(n-2)^{th}$ lower base resistor and the lower scaled input current; a $0^{th}$ lower input switch connected between the lower input current and the first bias voltage; first through $(n-2)^{th}$ lower input switches, each lower input switch being connected between the lower input current and the first end of respective first lower base resistors; an $(n-1)^{th}$ lower input switches connected between the lower input current and the second end of the $(n-_2)^{th}$ lower base resistor; an $n^{th}$ lower input switch connected between the lower input current and the second scaled input current; first through $(n-_2)^{th}$ lower feedback switches, each lower feedback switch being connected between the lower feedback current and the first end of a respective lower base resistor; and an $n^{th}$ lower feedback switch connected between the lower feedback current and the second end of the $(n-2)^{th}$ lower base resistor, wherein the k-factored resistors are all substantially n times the value of the base resistors, and wherein n is a whole number greater than one, and k is a positive number.

Preferably only one of the upper input switches is closed at a given time, only one of the upper feedback switches is closed at a given time, only one of the lower input switches is closed at a given time, and only one of the lower feedback switches is closed at a given time.

The amplifier may further comprise a voltage follower for providing the second bias voltage. The first and second bias voltages are preferably substantially the same.

Alternatively, a filter may be provided. Such a filter may include a first input voltage-to-current converter for receiving an input voltage and providing upper and lower first input currents; a first input current divider for receiving a first bias voltages the upper and lower first input currents, scaling the upper and lower first input currents, and providing upper and lower first scaled input currents; a first current follower for receiving the upper and lower first scaled input currents, and for providing upper and lower first output currents and upper and lower first output voltages; a first capacitor connected between the upper and lower first output voltages; a second input voltage-to-current converter for receiving the upper and lower first output voltages and providing upper and lower second input currents; a second input current divider for receiving a second bias voltage and the upper and lower second input currents, scaling the upper and lower second input currents, and providing upper and lower second scaled input currents; a second current follower for receiving the upper and lower second scaled input currents, and for providing upper and lower second output currents and a upper and lower second output voltage; a second capacitor connected between the upper and lower second output voltages; a first feedback voltage-to-current converter for receiving the upper and lower first output voltages and providing upper and lower first feedback currents; a first feedback current divider for receiving a third bias voltage and the upper and lower first feedback currents, scaling the upper and lower first feedback currents, and providing upper and lower first scaled feedback currents to the first current follower; a second feedback voltage-to-current converter for receiving the upper and lower second output voltages and providing upper and lower second feedback currents; and a second feedback current divider for receiving a fourth bias voltage and the upper and lower second feedback currents, scaling the upper and lower second feedback currents, and providing upper and lower second scaled feedback currents to the first current follower.

In addition, a filter may be provided that includes a first input voltage-to-current converter for receiving an input voltage and providing upper and lower first input currents; a first current divider for receiving a first bias voltage and the upper and lower first input currents, scaling the upper and lower first input currents, and providing upper and lower first scaled input currents; a first current follower for receiving the upper and lower first scaled input current and a bias voltage, and for providing upper and lower first output currents and upper and lower first output voltages; a first capacitor connected between the upper and lower first output voltages; a second input voltage-to-current converter for receiving the upper and lower first output voltages and providing upper and lower second input currents; a second current divider for receiving a second bias voltage and the upper and lower second input currents, scaling the upper and lower second input currents, and providing upper and lower second scaled input currents; a second current follower for receiving the upper and lower second scaled input currents and the bias voltage, and for providing upper and lower second output currents and upper and lower second output voltages; a second capacitor connected between the upper and lower second output voltages; a first feedback voltage-to-current converter for receiving the upper and lower first output voltages and providing upper and lower first feedback currents to the first current divider; and a second feedback voltage-to-current converter for receiving the second upper and lower output voltages and providing upper and lower second feedback currents to the first current divider.

The first and second current dividers are preferably programmable.

BRIEF DESCRIPTION OF THE DRAWINGS

The above and other objects and advantages of the present invention will become readily apparent from the description that follows, with reference to the accompanying drawings, in which.

DETAILED DESCRIPTION OF THE PREFERRED EMBODIMENTS

The present invention deals with using programmable transconductors for building amplifiers and filters. The adjustment of the transconductance may be performed either continuously or in steps. If the adjustment is performed continuously, it is achieved by modifying the bias current of the transconductor or by changing the bias voltage of transistors used as variable resistors in various circuit configurations. If the adjustment is performed in steps, it is achieved either by digitally selecting a number of transconductors in parallel, or by adjusting a tuning parameter, like the bias current of the transconductors, in steps.

One major object of this invention is to build the gain and filter stages using a reduced set of transconductors of different sizes, and to program the transconductances through the use of resistive current dividers placed at the output of the transconductors. This solution is compatible with existing integrated technologies and allows for operation at low supply voltages.

The present invention provides ways to accurately and digitally program the gain of a cascoded transconductor-based amplifier or the parameters of a cascoded transconductor-based filter while preserving such parameters as the input voltage dynamic range.

The present invention allows the implementation of various amplifier gains or various filter characteristics using essentially identical active structures, such as a transconductor. This kind of implementation reduces the layout effort and can lead to programmable analog array structures.

The proposed structures allow the implementation of large on-chip time constants without making use of very low transconductance stages that require large areas to implement and very low bias currents that are difficult to control.

The proposed structures also allow for offset compensation by using the same basic cells, i.e., transconductors and current dividers. Furthermore, these proposed solutions are appropriate for operating at low supply voltage.

Figure 9:
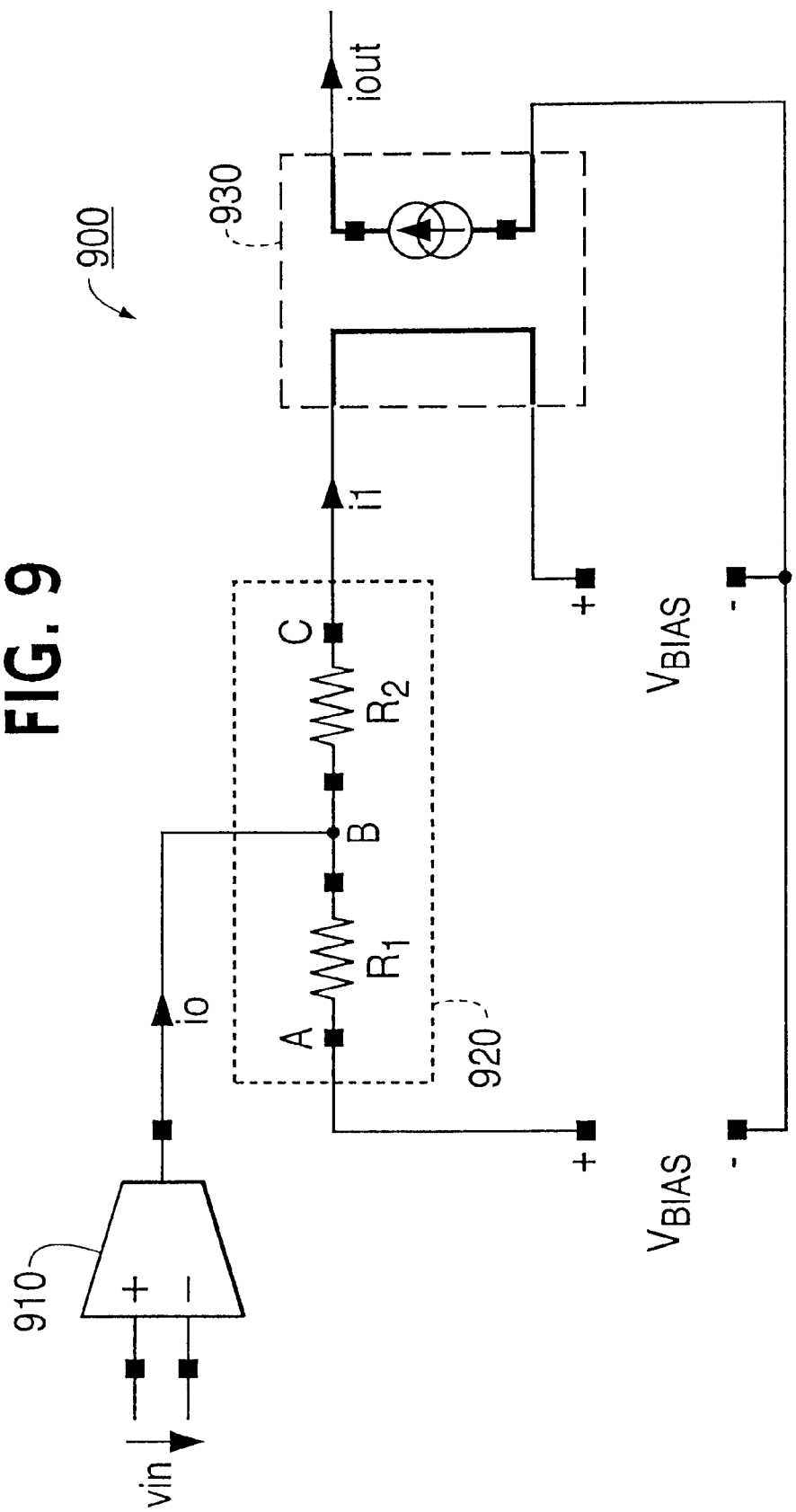
FIG. 9 is a circuit diagram of a transconductor with resistive divider according to a first preferred embodiment of the present invention.

The block diagram of a first preferred embodiment of such a transconductor is presented in FIG. 9. This transconductor 900 includes an input voltage-to-current converter 910 (e.g., an input transconductor), a current divider 920, and a current follower 930. The current divider 920 is preferably made out of first and second resistors $R_1$ and $R_2$ formed in series. The current follower 930 may be a cascode or a folded-cascode stage.

In particular, the first and second resistors $R_1$ and $R_2$ that make up the current divider 920 may be a single composite resistor R with a tap at point B to separate the composite resistor R into the first and second resistances $R_1$ and $R_2$.

The output current $i_0$ of the input transconductor 910 is injected into the tap of the current divider 920, i.e., point B. One end of the current divider 920 (point A) has a bias voltage applied. The r end of the current divider 920 (point C) is connected to the input of a current follower 930.

The bias voltage is preferably set to be at the same level as the input voltage of the current follower 930. The resistance of the bias voltage source is preferably substantially equal to the input resistance of the current follower 930 and much smaller than $R_1 \| R_2$, the parallel connection of $R_1$ and $R_2$.

For this circuit, the output current is:

$$i_{out} = \left( \frac{R_1}{R_1 + R_2} \times g_m \right) \times v_{in} \tag{22}$$

where $g_m$ is the transconductance of the input transconductor 910, and $v_{in}$ is the input voltage of the transconductor 900. This means the stage has an equivalent transconductance:

$$g_{meq} = \frac{R_1}{R_1 + R_2} \times g_m \tag{23}$$

The exact equivalent transconductance $g_{meq}$ thus depends upon the location of the tap point B between the first and second resistors $R_1$ and $R_2$.

The composite resistor R (i.e., $R_1$–$R_2$) can be implemented in an integrated Circuit as a passive component (e.g., a diffusion, polysilicon, or metal resistor) or can be composed of active resistors like MOS transistors in the triode region. In order to have a better matching of the active resistors, a biasing strategy which produces no output DC currents from the input transconductor was disclosed in U.S. patent application Ser. No. 09/689,811, titled "DIGITALLY PROGRAMMABLE TRANSCONDUCTOR" by Horta Giuroiu, filed Oct. 13, 2000, the contents of which are hereby incorporated by reference in their entirety.

Figure 10:
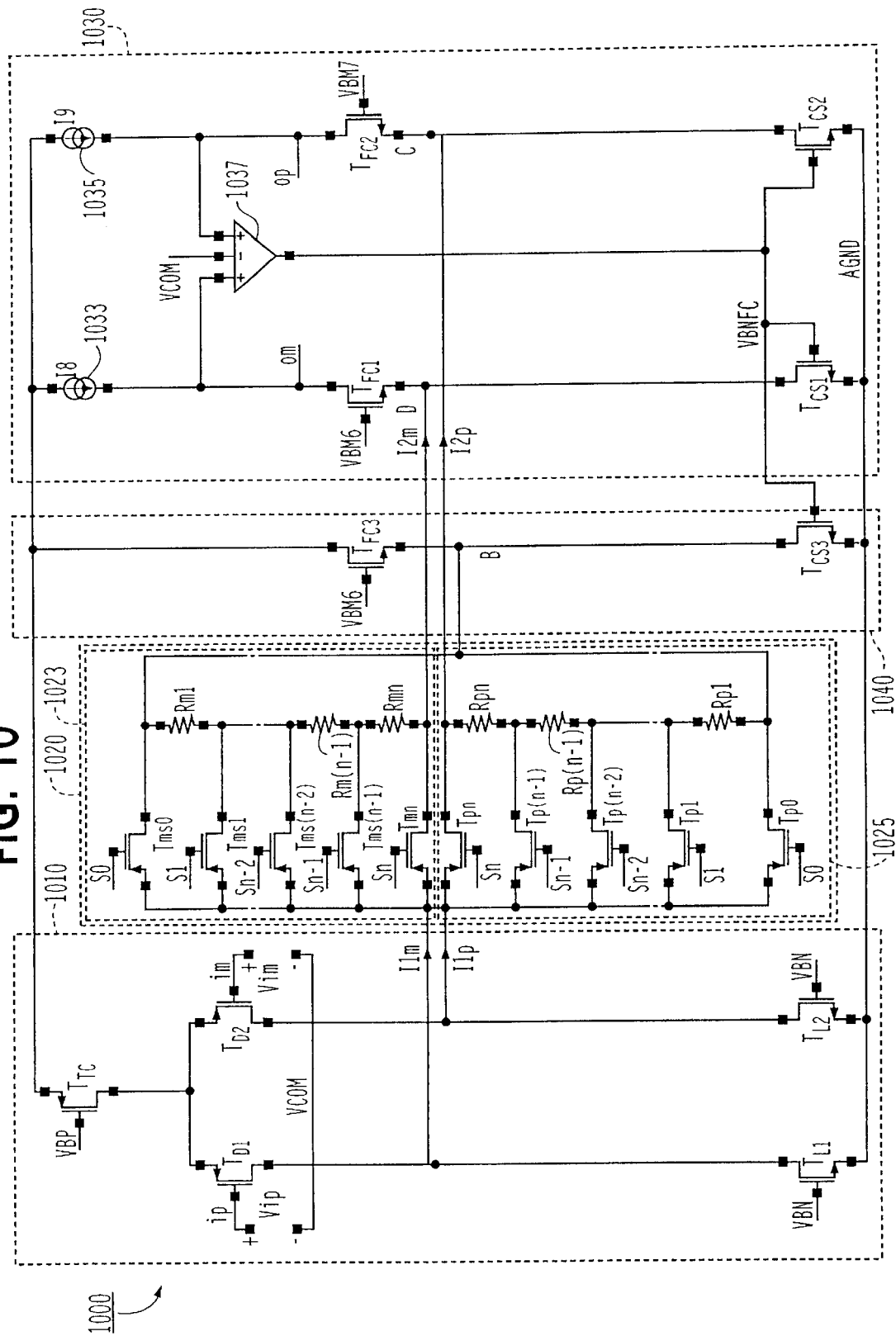
FIG. 10 is a circuit diagram of a transconductor with programmable resistive divider.

One way of implementing the sort of programmable transconductor of FIG. 9 is presented in FIG. 10. The transconductor circuit 1000 of FIG. 10 includes a transconductor 1010, a resistive divider 1020, a current follower 1030, and a voltage follower 1040.

The transconductor 1010 includes first and second differential transistors $T_{D1}$ and $T_{D2}$, a tail current transistor $T_{TC}$, and first and second load transistors $T_{L1}$ and $T_{L2}$. The resistive divider 1020 includes an upper resistor chain 1023 having first through $n^{th}$ upper resistors $R_{m1}, R_{m2}, \ldots, R_{mn}$; and a lower resistor chain 1025 having first through $n^{th}$ lower resistors $R_{p1}, R_{p2}, \ldots, R_{pn}$, $0^{th}$ through n upper transistor switches $T_{mS0}, T_{mS1}, \ldots, T_{mSn}$, and $0^{th}$ through $n^{th}$ lower switches $T_{pS0}, T_{pS1}, \ldots, T_{pSn}$. Depending upon which switches are activated, an upper input to the resistive divider 1020 is connected to one of a plurality of upper taps $m_0, m_1, \ldots, m_n$ formed between the first through $n^{th}$ upper resistors $R_{m1}, R_{m2}, \ldots, R_{mn}$, and similarly, a lower input is connected to one of a plurality of lower taps $p_0, p_1, \ldots, p_n$ formed between the first through $n^{th}$ lower resistors $R_{p1}, R_{p2}, \ldots, R_{pn}$.

The current follower 1030 includes a first and second folded-cascode transistors $T_{FC1}$ and $T_{FC2}$ forming a folded-cascode, the first and second current sources 1033 and 1035, first and second current source transistors $T_{CS1}$ and $T_{CS2}$, and an output common-mode setting amplifier 1037.

The voltage follower 1040 includes a third folded-cascode transistor $T_{FC3}$ and a third current source transistor $T_{CS3}$. The third folded-cascode transistor $T_{FC3}$ and the third current source transistor $T_{CS3}$ are preferably twice the size of the first folded-cascode transistor $T_{FC1}$ and a first current source transistor $T_{CS1}$, respectively. The voltage follower 1040 acts as a bias for the ends of the resistor chains $R_{m1}, R_{m2}, \ldots, R_{mn}$ and $R_{p1}, R_{p2}, \ldots, R_{pn}$, which are connected to the voltage follower at point B.

The common-mode setting is preferably a generic one, and the transconductor may be biased as to have zero output DC currents.

The output currents $i_{1p}$ and $i_{1m}$ of an input transconductor 1010 are connected to the resistive divider 1020. The current $i_{1p}$ is injected into one of the lower taps $p_0, p_1, p_n$ of the resistors $R_{p1}, R_{p2}, \ldots, R_{pn}$, as specified by a selection signals $S_0, S_1, \ldots, S_n$. Similarly, The current $i_{1m}$ is injected into one of the upper taps $m_0, m_1, \ldots, m_n$ of the resistors $R_{m1}, R_{m2}, \ldots, R_{mn}$, also as specified by a selection signals $S_0, S_1, S_n$.

The currents $i_{1p}$, $i_{1m}$ are then scaled by the resistive divider 1020, and the resulting output currents $i_{2p}$, $i_{2m}$ are provided as inputs for the current follower 1030 (a folded-cascode in this implementation). The current follower 1030 in turn provides currents to the outputs $o_p$, $o_m$.

By using this configuration, the equivalent transconductance of the entire circuit is a fraction of the input stage transconductance. Furthermore, the transconductance of the differential pair $T_{D1}$ and $T_{D2}$ can be tuned to a reference value by changing the bias voltages $V_{BP}$, $V_{BN}$ supplied to the tail current transistor $T_{TC}$ and to the first and second load transistors $T_{L1}$ and $T_{L2}$, respectively.

Figure 1:
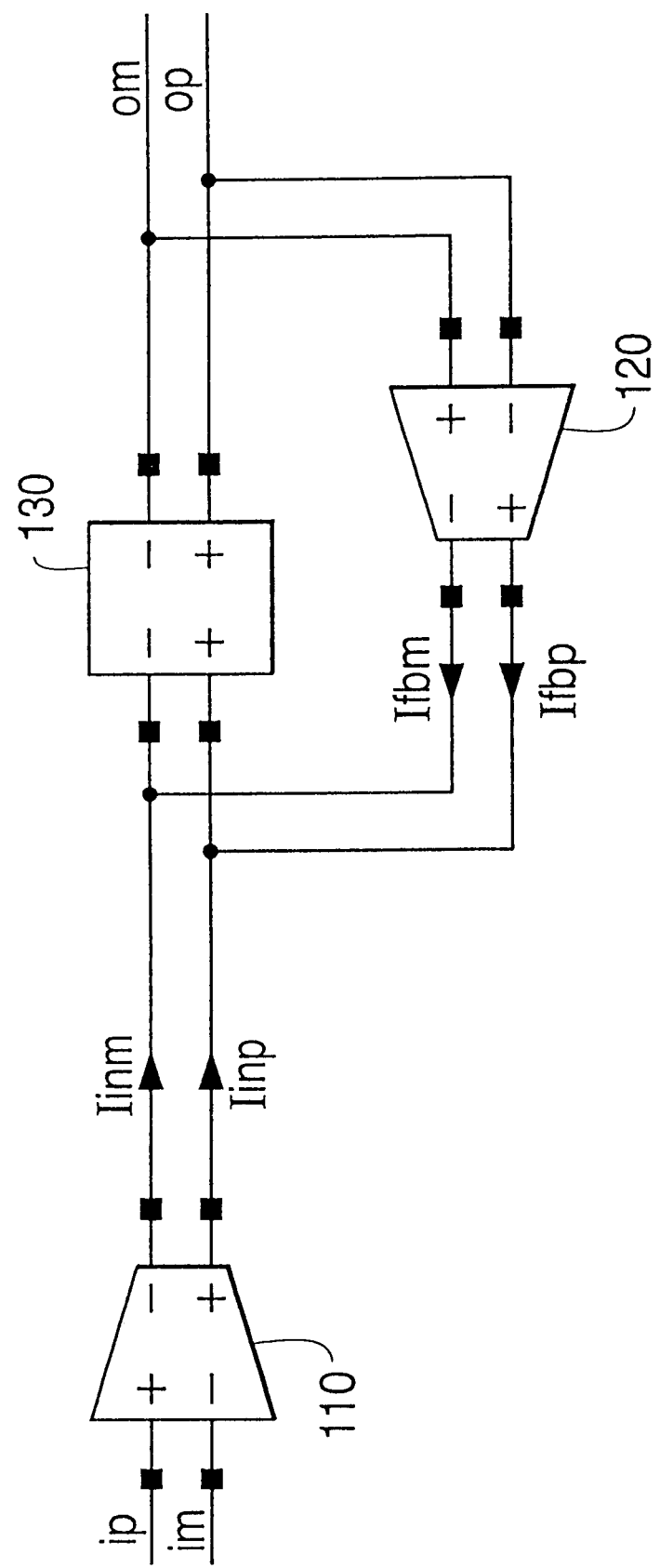
FIG. 1 is a circuit diagram of a conventional transconductor-transconductor voltage amplifier.
Figure 2:
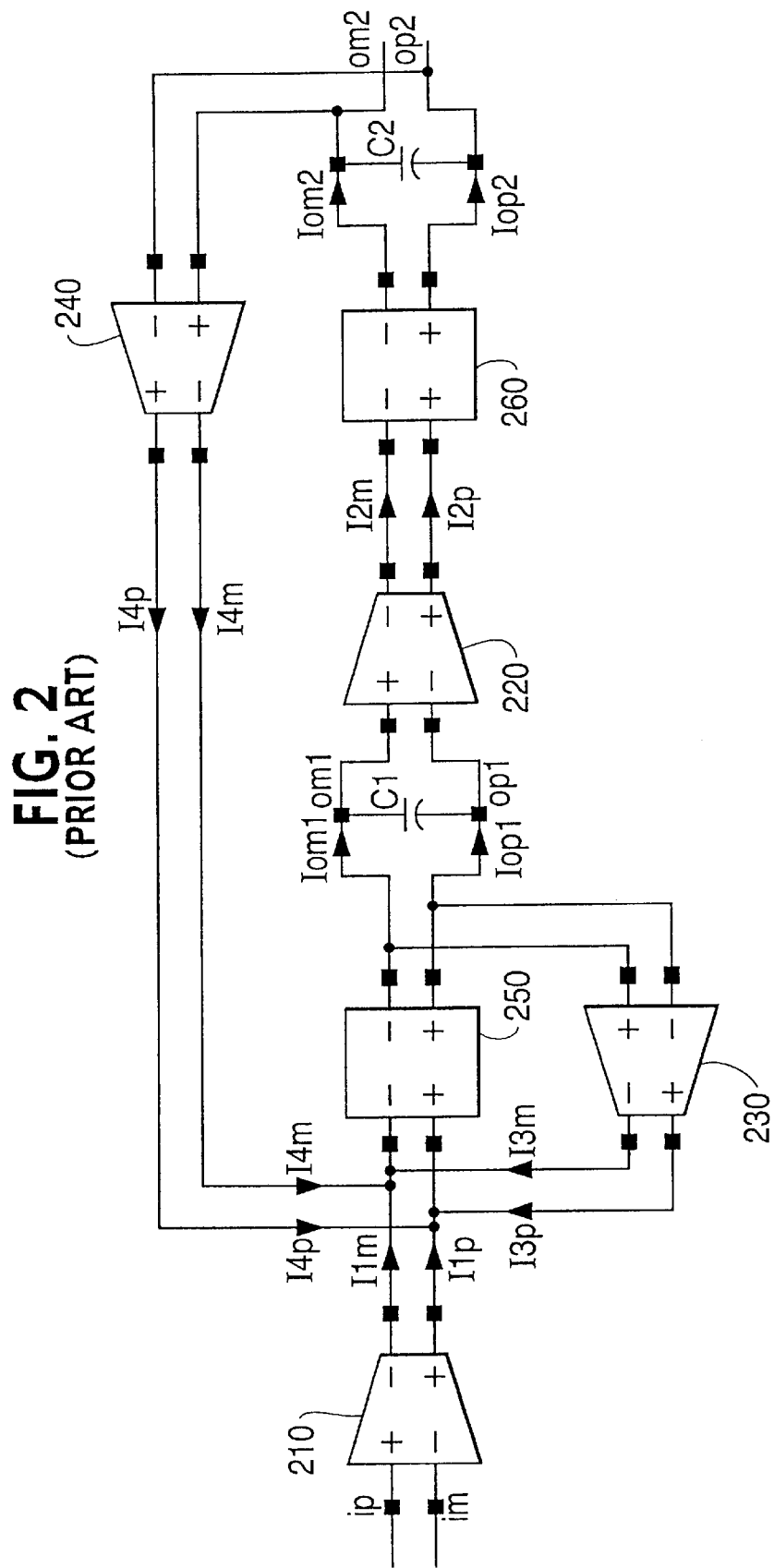
FIG. 2 is a circuit diagram of a conventional cascode/folded-cascode $G_m$-C based biquad filter.
Figure 3:
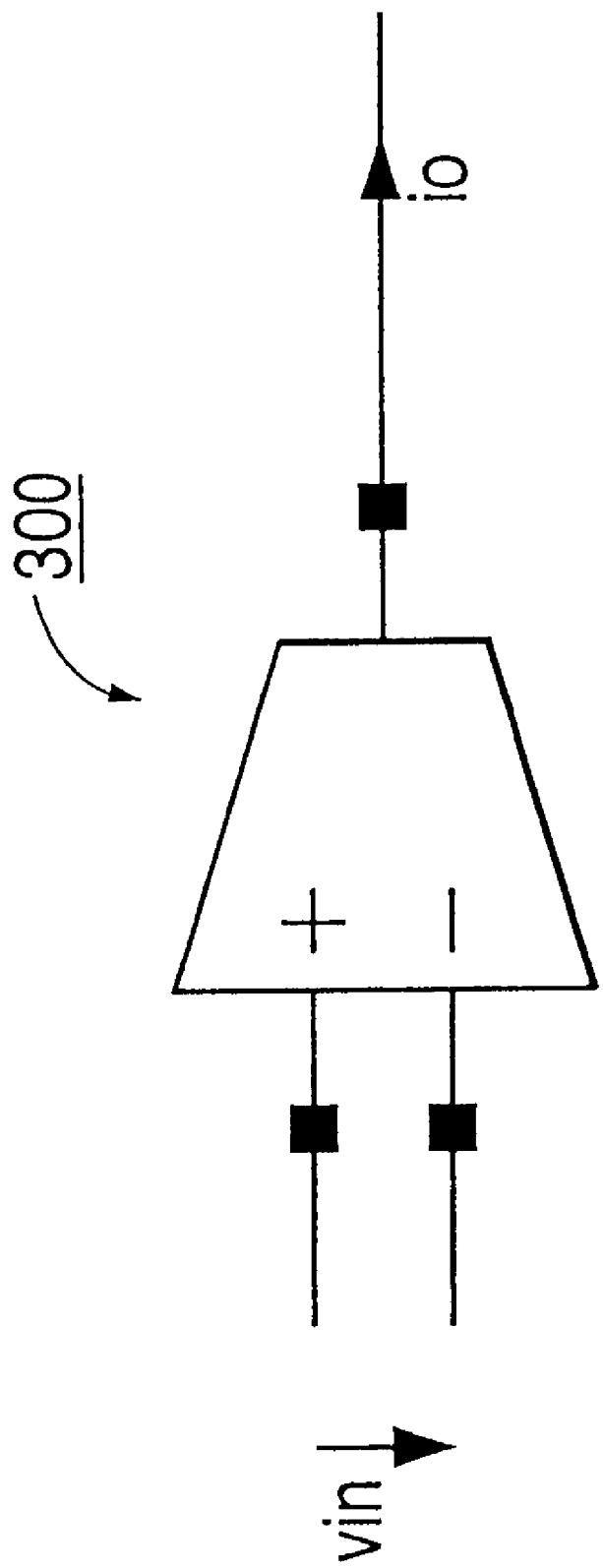
FIG. 3 is a circuit diagram of a generic transconductor.
Figure 4:
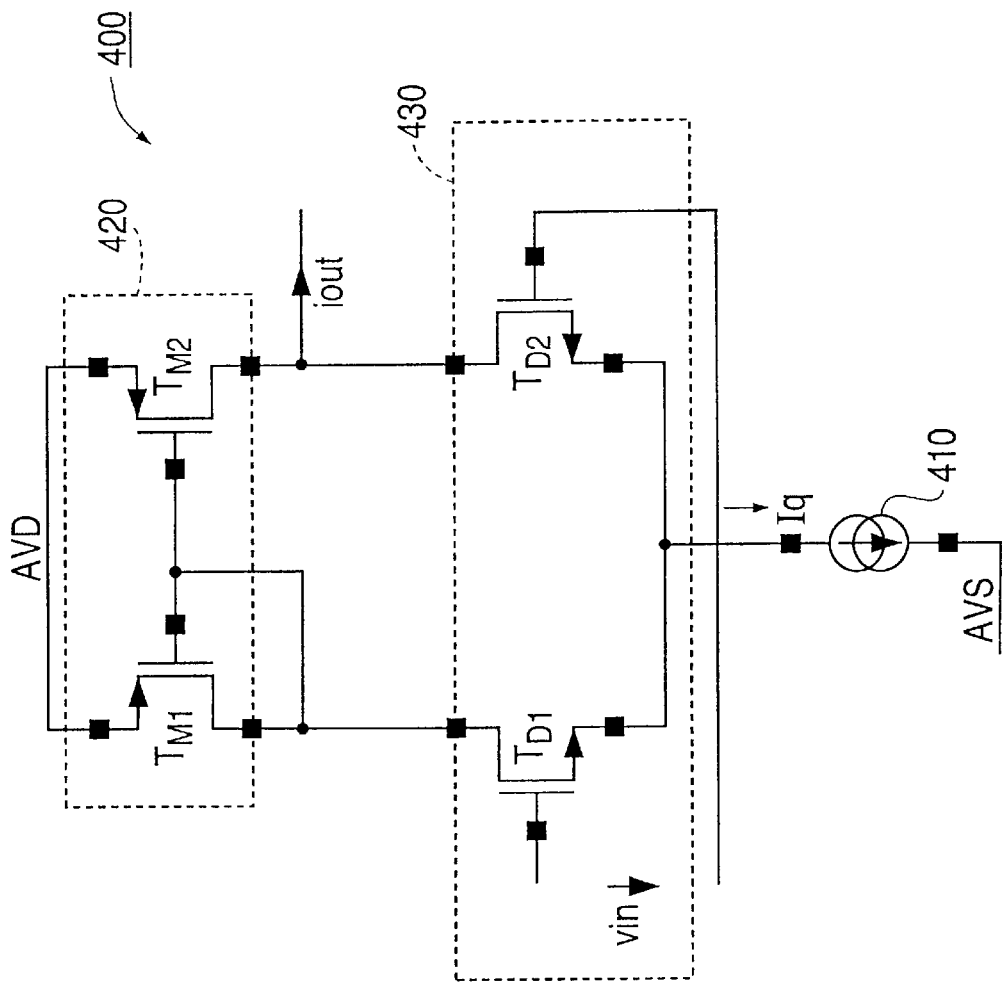
FIG. 4 is a circuit diagram of a conventional continuously-variable, current-controlled transconductance.
Figure 5:
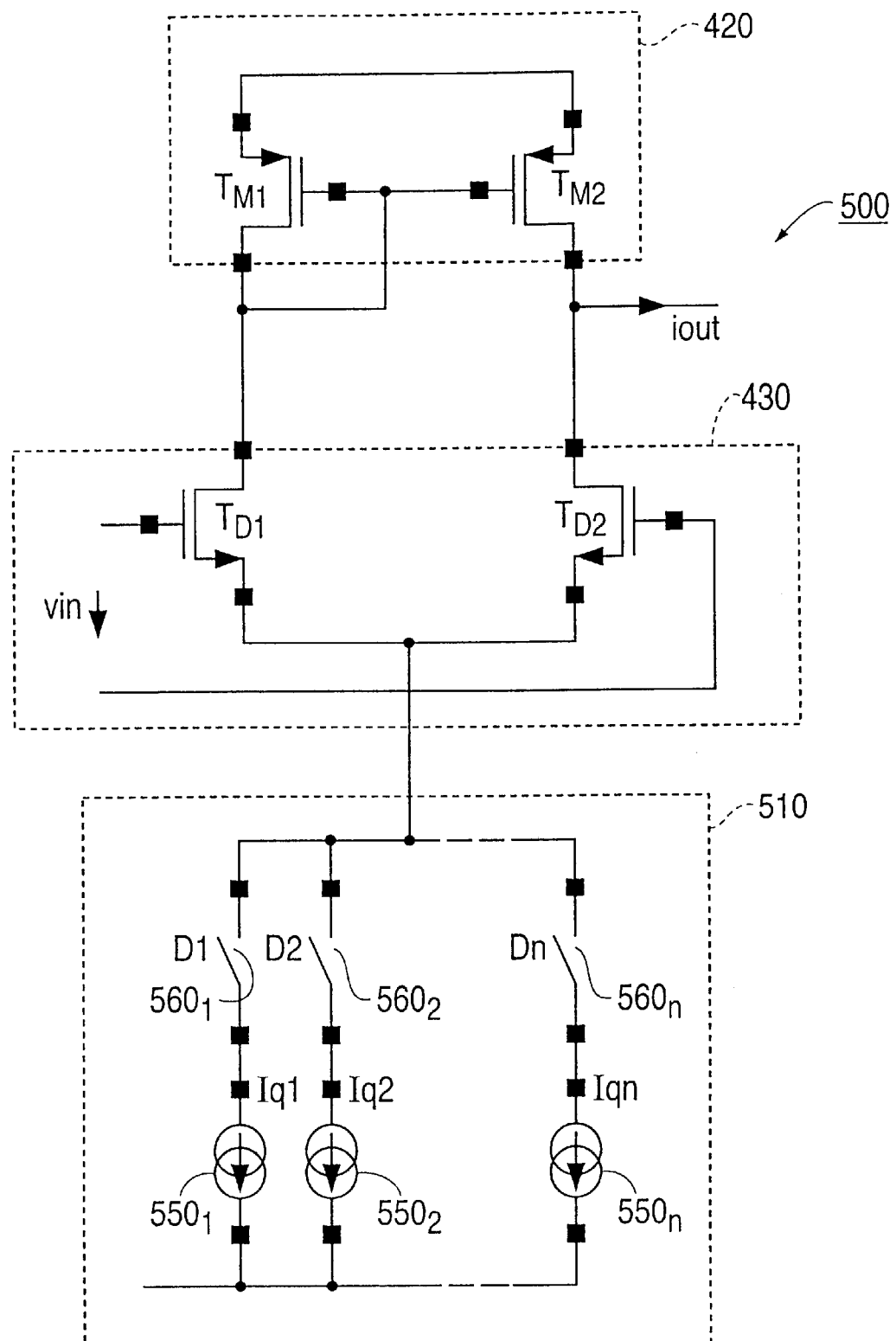
FIG. 5 is a circuit diagram of a conventional variable-step, current-controlled transconductance.
Figure 6:
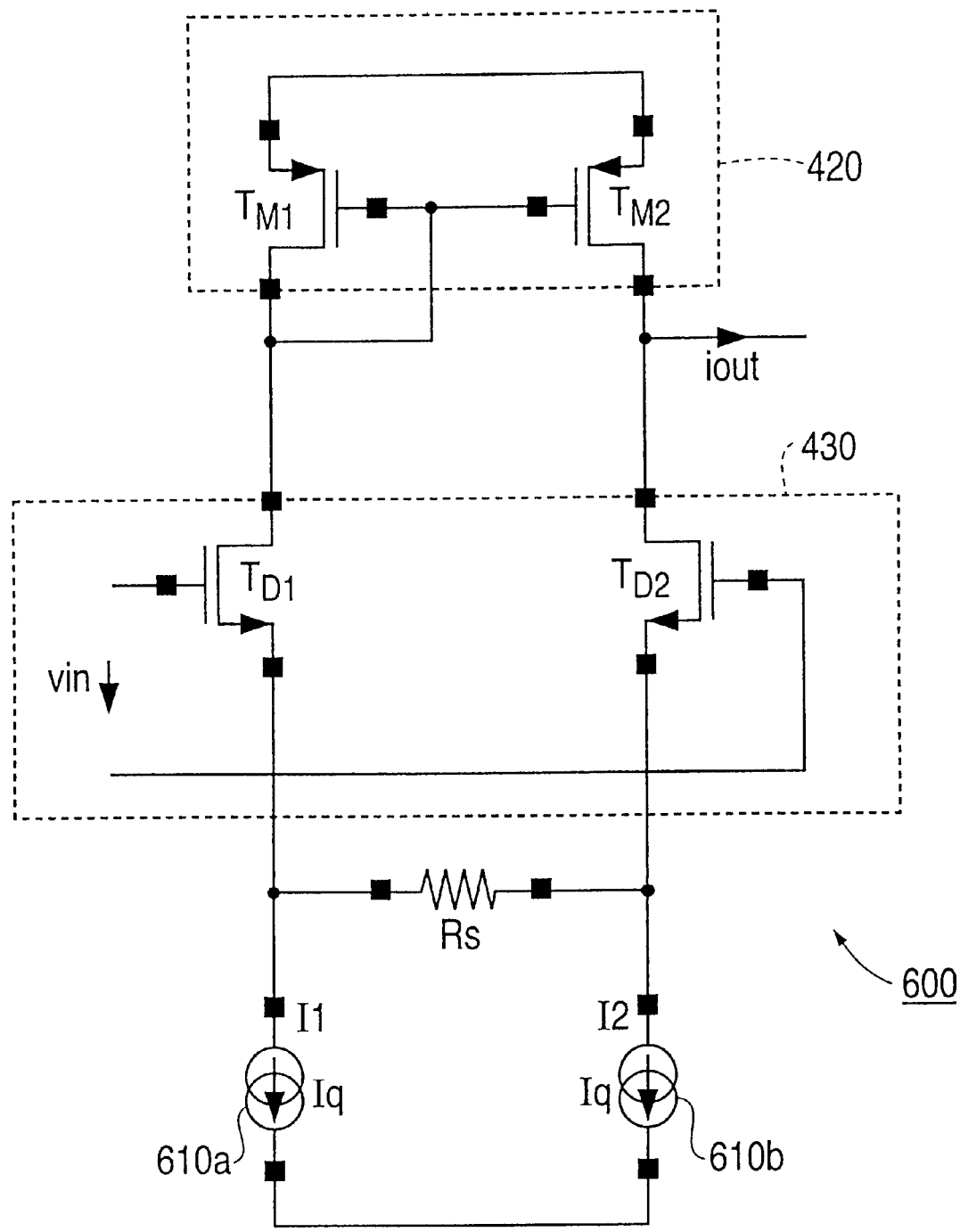
FIG. 6 is a circuit diagram of a conventional resistor-controlled transconductance.
Figure 7:
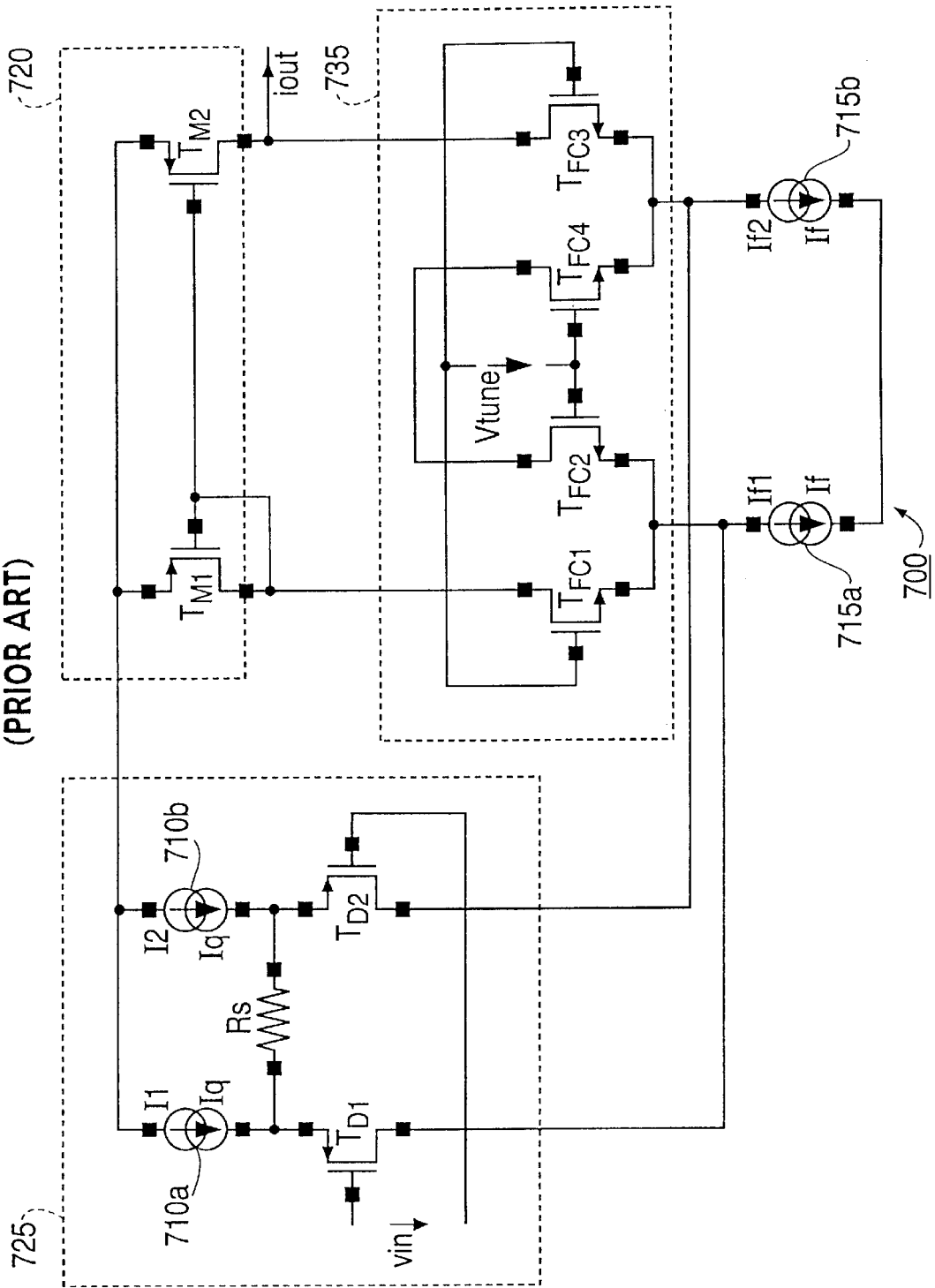
FIG. 7 is a circuit diagram of a conventional continuously-variable transconductor with output current steering.
Figure 8:
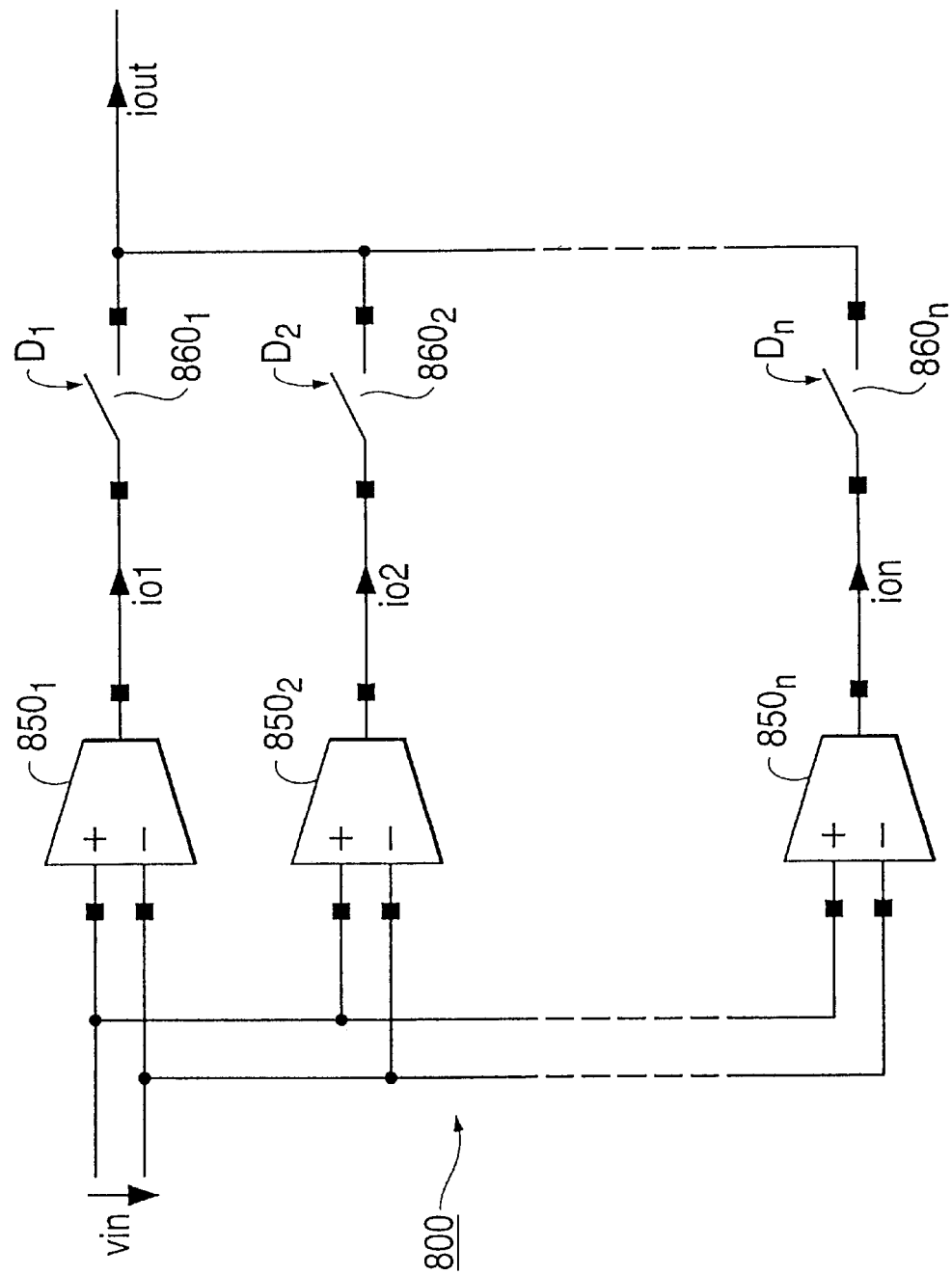
FIG. 8 is a circuit diagram of a parallel connection of identical transconductors.

This type of programmable transconductor can be used to build a programmable voltage gain amplifier following the approach of FIG. 1.

Figure 11:
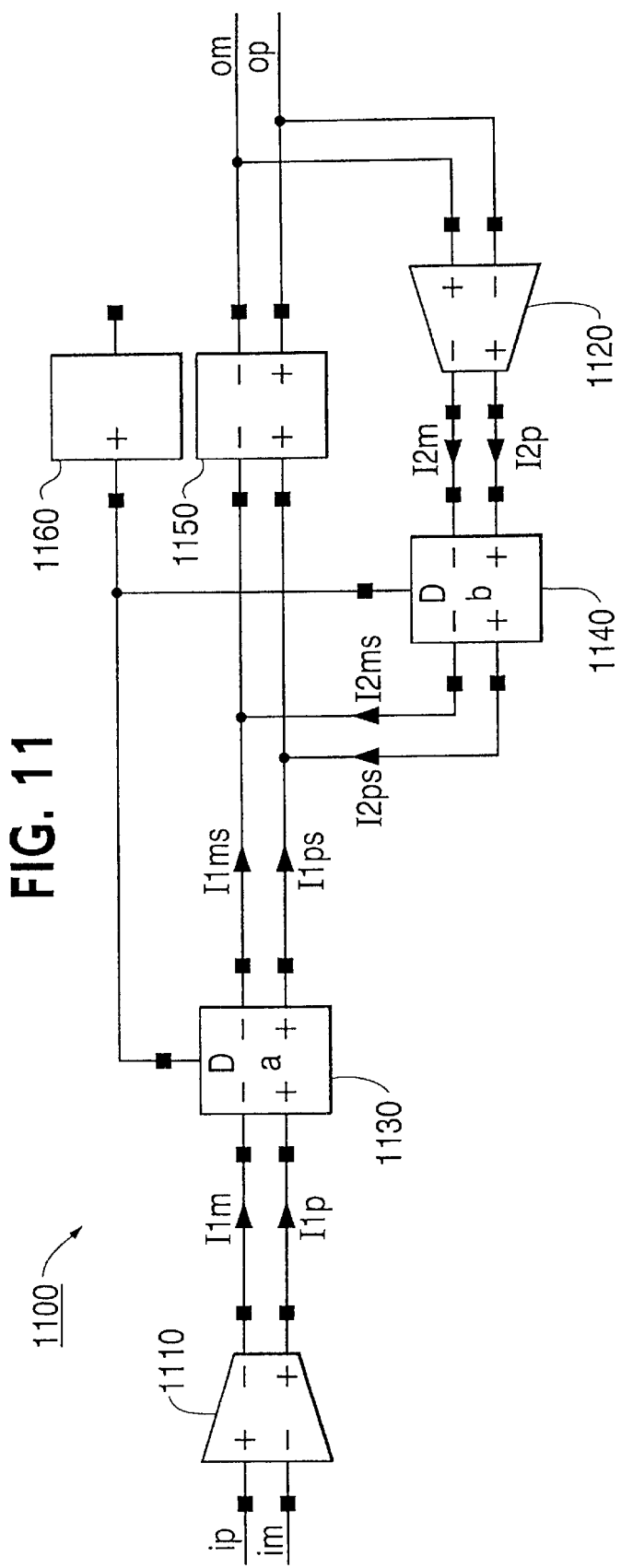
FIG. 11 is a circuit diagram of a transconductor-transconductor voltage amplifier using intermediary resistive dividers for setting the gain, according to a second preferred embodiment of the invention.

A transconductor-transconductor ($g_m$-$g_m$) voltage amplifier according to a second preferred embodiment of the present invention is presented in FIG. 11. As shown in FIG. 11, the voltage amplifier 1100 includes an input transconductor 1110, a feedback transconductor 1120, an input resistive divider 1130, a feedback resistive divider 1140, a current follower 1150, and a bias circuit 1160.

The current follower 1150 is preferably a folded-cascode, and the bias circuit 1160 is preferably a dummy folded cascode. The bias circuit 1160 generates a DC voltage equal to the input DC voltage of the current-follower 1150. The input resistance of the bias circuit 1160 is preferably substantially equal to half the input resistance of the individual branches of current-follower 1150.

Preferably, the input transconductor 1110 and the feedback transconductor 1120 are biased in such a way as to have zero DC output currents. This is done so that there will be no DC current flowing through either of the resistive dividers 1130 and 1140. If the input resistive divider 1130 is set for a current gain of (a<1) and the feedback resistive divider 1140 is set for a current gain of (b <1), then the voltage gain of the stage (i.e., the $g_m$-$g_m$ voltage amplifier) will be:

$$A_v = \frac{v_{difo}}{v_{difi}} = -\frac{a \times g_{mi}}{b \times g_{mf}} = -\frac{a}{b} \times \frac{g_{mi}}{g_{mf}}, \tag{24}$$

where $g_{mi}$ is the transconductance of the input transconductor 1110, $g_{mf}$ is the transconductance of the feedback transconductor 1120, $v_{difo}$ is differential output voltage ($v_{op} - v_{om}$), and $v_{difi}$ is the differential input voltage ($v_{ip}-v_{im}$).

The scaled input currents (i.e., $i_{1ms}$ and $i_{1ps}$) and the scaled feedback currents ($i_{2ms}$ and $i_{2ps}$) are respectively summed at the low impedance inputs of the output current-follower 1150.

The input and feedback current dividers 1130 and 1140 can be programmable.

Figure 12:
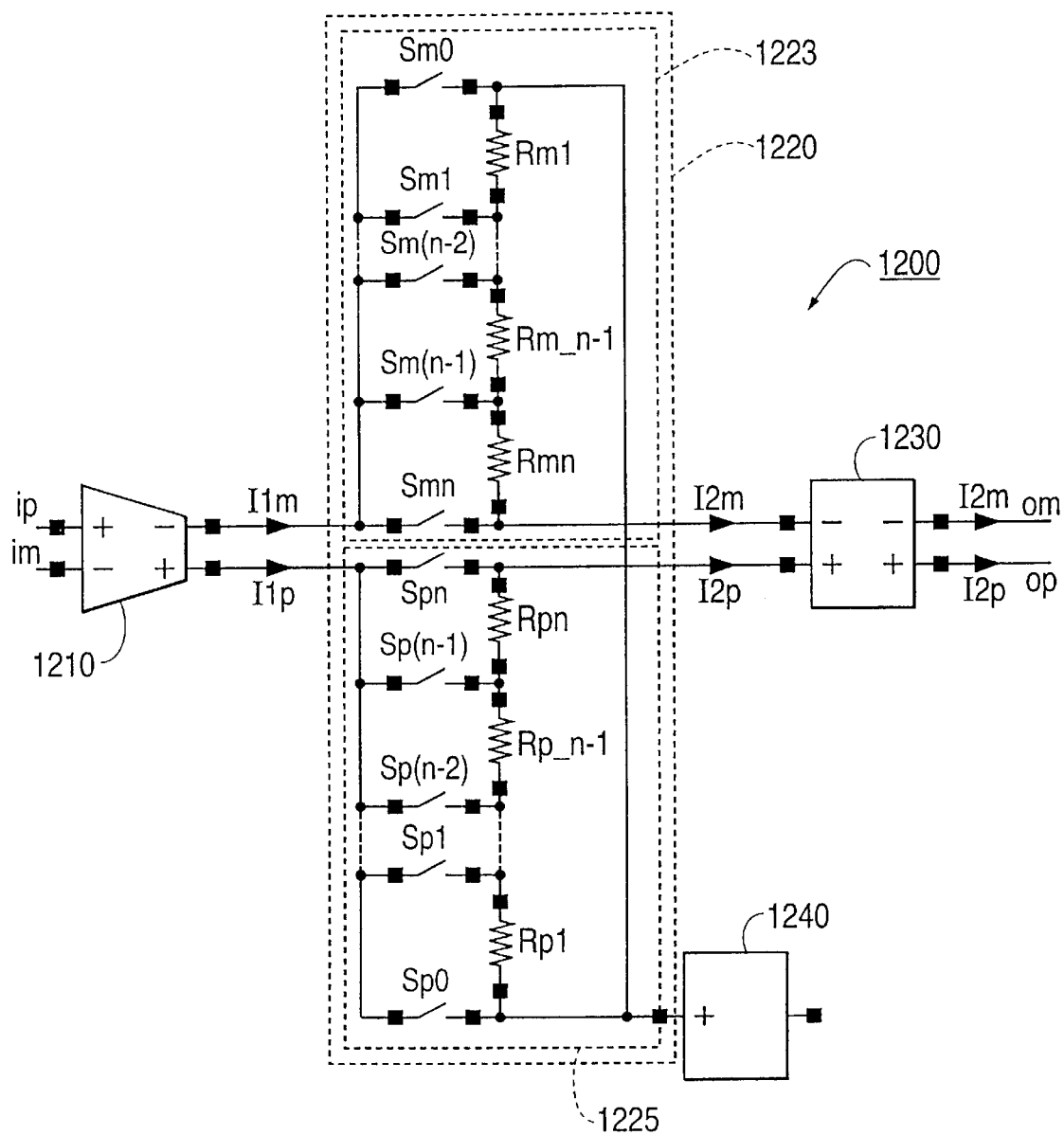
FIG. 12 is a circuit diagram of a variable-step, folded-cascode transconductor biased with a dummy folded-cascode stage, and with an intermediary resistive chain providing variable transconductance, according to preferred embodiments of the present invention.
Figure 13:
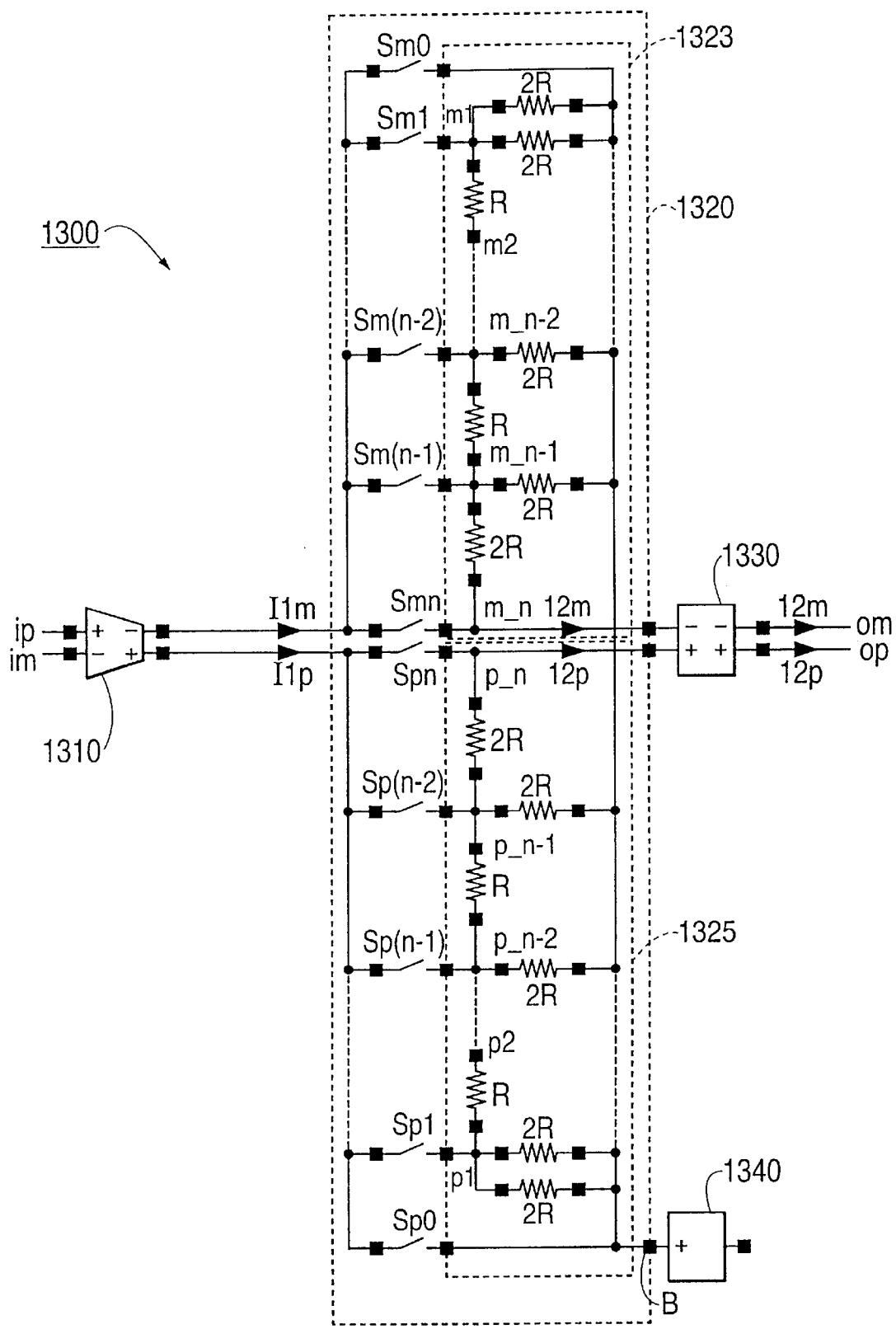
FIG. 13 is a circuit diagram of a folded-cascode transconductor with intermediary R-2R network having exponentially controlled transconductance, according to preferred embodiments of the present invention.

FIG. 12 shows an example of a linear chain current divider, and FIG. 13 shows an example of an R-kR current divider (illustrated as an R-2R current divider in this example). In in addition to showing examples of the current dividers, each of FIGS. 12 and 13 also includes additional circuitry to illustrate the operation of the current dividers.

The programmable transconductor of FIG. 12 includes a differential output transconductor 1210, a linear current divider 1220, a differential output current follower 1230, and a bias circuit 1240. The differential output transconductor has a transconductance of $g_m$.

The linear current divider 1220 includes upper and lower resistor chains 1223 and 1225. The upper resistor chain 1223 includes first through $n^{th}$ upper resistors $R_{m1}, R_{m2}, \ldots, R_{mn}$, and $0^{th}$ through $n^{th}$ upper switches $S_{m0}, S_{m1}, \ldots, S_{mn}$. The $0^{th}$ through $n^{th}$ upper switches $S_{m0}, S_{m1}, \ldots S_{mn}$ operate to inject the output current $i_{1m}$ into a corresponding tap into the first through $n^{th}$ upper resistors $R_{m1}, R_{m2}, \ldots, R_{mn}$. Similarly, the lower resistor chain 1225 includes first through $n^{th}$ lower resistors $R_{p1}$, $Rp_2, \ldots, R_{pn}$, and $0^{th}$ through $n^{th}$ lower switches $S_{p0}, S_{p1}, \ldots, S_{pn}$. The $0^{th}$ through $n^{th}$ lower switches $S_{p0}, S_{p1}, \ldots, S_{pn}$ operate to inject the output current $i_{1p}$ into a corresponding tap into the first through $n^{th}$ lower resistors $R_{p1}, R_{p2}, \ldots, R_{pn}$.

The differential input transconductor 1210, differential output current follower 1230, and bias circuit 1240 have the same role as the differential input transconductor 1110, the current follower 1130, and the bias circuit 1160, respectively, as described with reference to FIG. 11.

The equivalent transconductance $g_{meq}$ of the entire stage depends upon the positions of the switches $S_{mk}$ and $S_{pk}$. It is supposed that only one switch at a time is closed on each resistive chain. In this case:

$$g_{meq}(k) = \frac{\sum_{j=1}^{k} R_j}{\sum_{j=1}^{n} R_j} g_m \quad k = 1, 2, \ldots, n \tag{26}$$

The upper and lower resistor chains 1223 and 1225 can be replaced by upper and lower R-kR networks. FIG. 13 shows a circuit diagram using R-2R networks.

The programmable transconductor of FIG. 13 includes a differential input transconductor 1310, an R-kR current divider 1320 (a R-2R current divider, in this case), a differential output current follower 1330, and a bias circuit 1340. The differential input transconductor 1310, the differential output current follower 1330, and the bias circuit 1340 are essentially identical in structure and operation to the differential input transconductor 1210, the differential output current follower 1230, and the bias circuit 1240 of FIG. 12.

The R-2R current divider network 1320 includes upper and lower resistor formations 1323 and 1325. The upper resistor formation 1323 includes a plurality of resistors all of a value R or 2R, connected in an R-2R formation, and $0^{th}$ through $n^{th}$ upper switches $S_{m0}, S_{m1}, \ldots, S_{mn}$. Similarly, the upper resistor formation 1325 includes a plurality of resistors all of a value R or 2R, also connected in an R-2R formation, and $0^{th}$ through $n^{th}$ lower switches $S_{p0}, S_{p1}, \ldots, S_{pn}$.

The R-2R current divider 1320 network is connected to the outputs $i_{1m}$ and $i_{1p}$ of the differential input transconductor 1310. In addition, all but one of the 2R branches of the R-2R networks are connected to the bias point B of the bias circuit 1240. The internal nodes of the upper (p) and lower (m) branches are designated $p_1, p_2, \ldots, p_{(n-1)}$; and $m_1, m_2, \ldots, m_{(n-1)}$, respectively.

The first output $i_{1m}$ of the differential input transconductor 1310 is connected through the switches $S_{m1}, S_2, \ldots, S_{m(n-1)}$ to the nodes $m_1, m_2, \ldots, m_{(n-1)}$, respectively. Similarly, the second output $i_{1p}$ of the differential input transconductor 1310 is connected through the switches $S_{p1}, S_{p2}, \ldots, S_{p(n-1)}$ to the nodes $p_1, p_2, \ldots, p_{(n-1)}$, respectively. The switches $S_{p0}, S_{m0}$ connect the outputs of the input transconductor 1310 to the bias point B, allowing no current to flow into the output current follower 1330. The switches $S_{pn}, S_{mn}$ connect the outputs of the input transconductor 1310 directly to the corresponding inputs of the output current follower 1330. There is only one switch closed at a time on each of the upper (p) and lower (m) branches. (In this case the 'p' stands for plus, and the 'm' stands for minus.)

When the first output current $i_{1m}$ is connected through the switch $S_{mk}$ to the node $m_k$ of the upper (m) branch and the second output current $i_{1p}$ is connected through the switch $S_{pk}$ to the node $p_k$ of the lower (p) branch, the output currents $i_{2m}$ and $i_{2p}$ of the resistive divider 1320 are:

$$i_{2p}(0) = 0 \tag{27}$$

$$i_{2p}(k) = \frac{2^k}{3 \times 2^{n-1}} i_{1p} \quad (k = 1, 2, \ldots, n-1) \tag{28}$$

$$i_{2p}(n) = i_{1p} \tag{29}$$

$$i_{2m}(0) = 0 \tag{30}$$

$$i_{2m}(k) = \frac{2^k}{3 \times 2^{n-1}} i_{1m} \quad (k = 1, 2, \ldots, n-1) \tag{31}$$

$$i_{2m}(n) = i_{1m} \tag{32}$$

As a result, the overall transconductance will be:

$$g_{meq}(0) = 0 \tag{33}$$

$$g_{meq}(k) = \frac{2^k}{3 \times 2^{n-1}} g_m \quad (k = 1, 2, \ldots, n-1) \tag{34}$$

$$g_{meq}(n) = g_m \tag{35}$$

The circuit of FIG. 13 thus works as a programmable exponential attenuator for the transconductance.

The programmable resistive dividers shown in FIGS. 12 and 13 can be applied to an already established cascode or folded-cascode transconductor without disturbing the operating points.

The folded-cascode 1230/1330 and the dummy folded-cascode 1240/1340 are essential to the functioning of the circuit since they provide a very low impedance load to the resistors $R_{p1}, R_{m1}, R_{mn}$, and $R_{pn}$.

Figure 14:
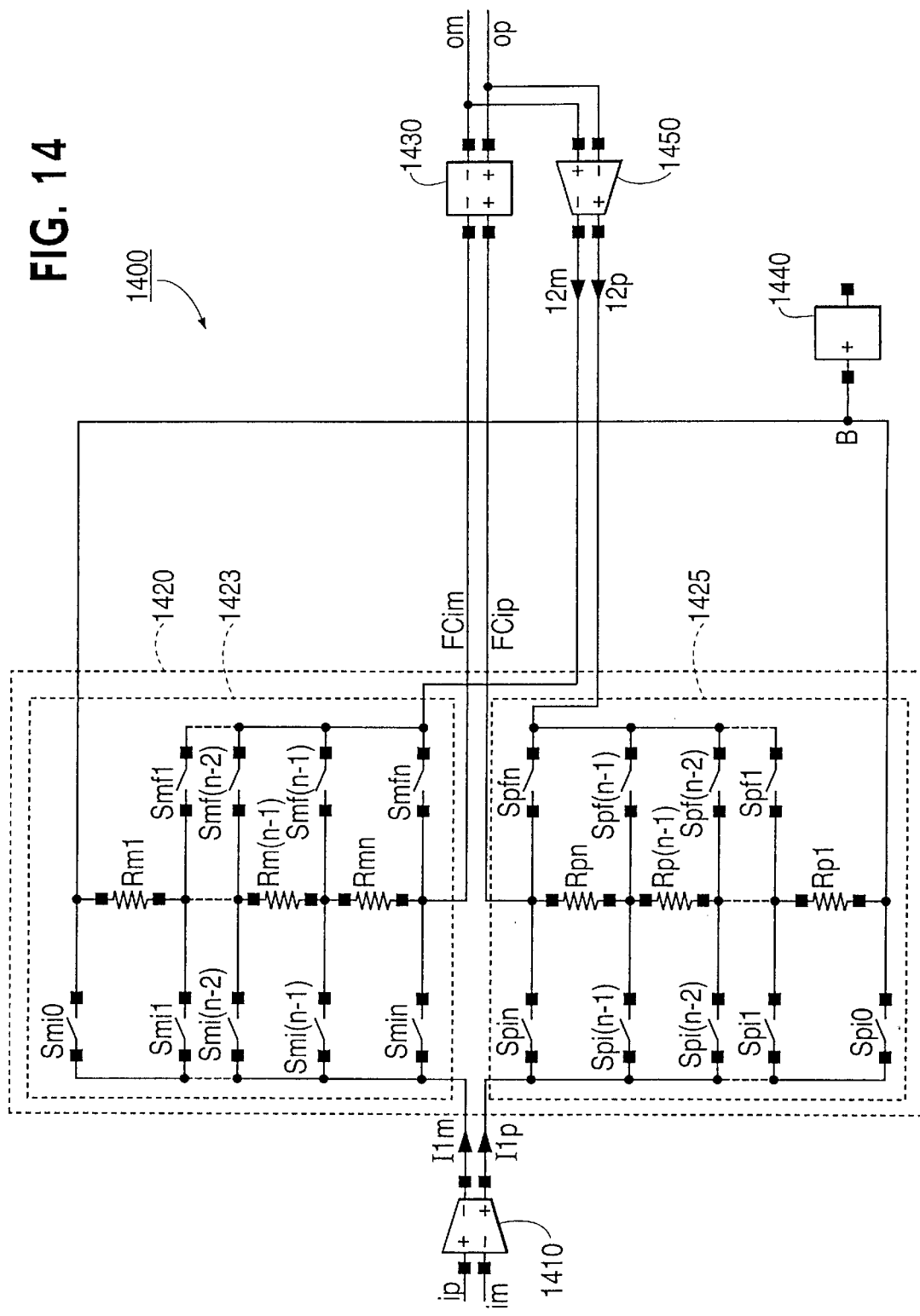
FIG. 14 is a circuit diagram of a transconductor-transconductor voltage amplifier using intermediary (linear) resistive dividers for adjusting the gain, according to a third preferred embodiment of the present invention.
Figure 15:
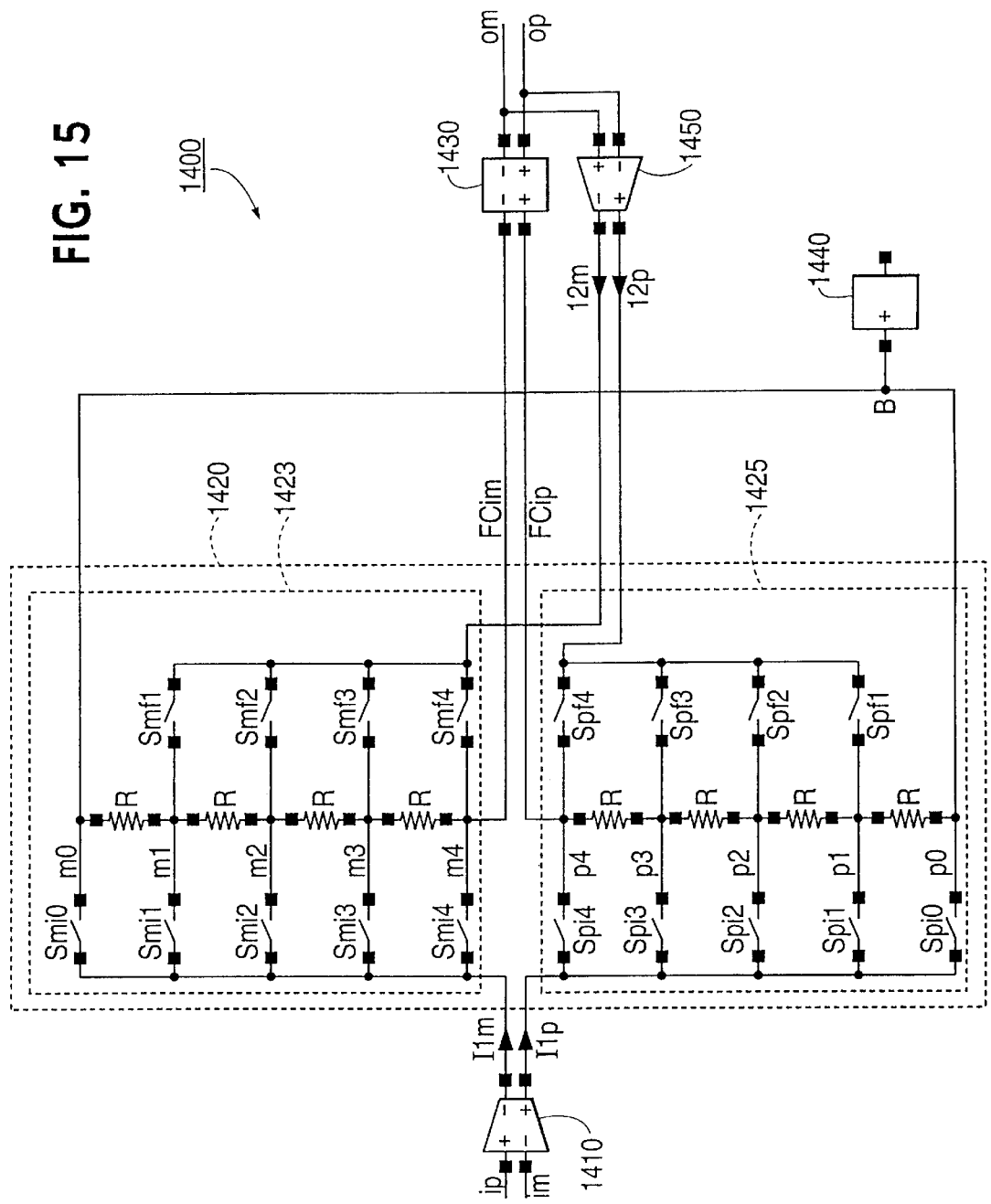
FIG. 15 is an illustration of the circuit of FIG. 14.

FIG. 14 shows an amplifier with two merged linear chains, according to a third preferred embodiment of the present invention. As shown in FIG. 14, the amplifier includes an input transconductor 1410, a resistor network 1420, a differential input current follower 1430, a bias circuit 1440, and a feedback transconductor 1450. FIG. 15 shows an example of the third preferred embodiment when the upper and lower portions of the resistive divider includes four equal resistors.)

The output currents $i_{1m}$, and $i_{1p}$ of the input transconductor 1410 can be injected into any one of the corresponding "$m_k$" or "$p_k$" nodes (where k=0, 1, . . . , n). The output currents $i_{2m}$ and $i_{2p}$ of the feedback transconductor 1450 can be injected into any one of the corresponding "$m_k$" and "$p_k$" nodes (where k=1, 2, . . . , n).

If the resistors have equal values, then the voltage gain range can be programmed to any of the values:

$$A_v = -\frac{q/n}{r/n} \times \frac{g_{mi}}{g_{mf}} = -\frac{q}{r} \times \frac{g_{mi}}{g_{mf}} = -\frac{q}{r} \times A_0; \tag{36}$$

$$A_0 = \frac{g_{mi}}{g_{mf}}; \quad q = 0, 1, \ldots, n; r = 1, 2, \ldots, n;$$

For example, if the upper and lower portions 1423 and 1425 of the resistive divider 1420 each include four equal resistors (as shown in FIG. 15), the possible gain values are:

$$\left\{0, \frac{1}{4}, \frac{1}{3}, \frac{1}{2}, \frac{2}{3}, \frac{3}{4}, 1, \frac{4}{3}, \frac{3}{2}, 2, 3, 4\right\}$$

Figure 16:
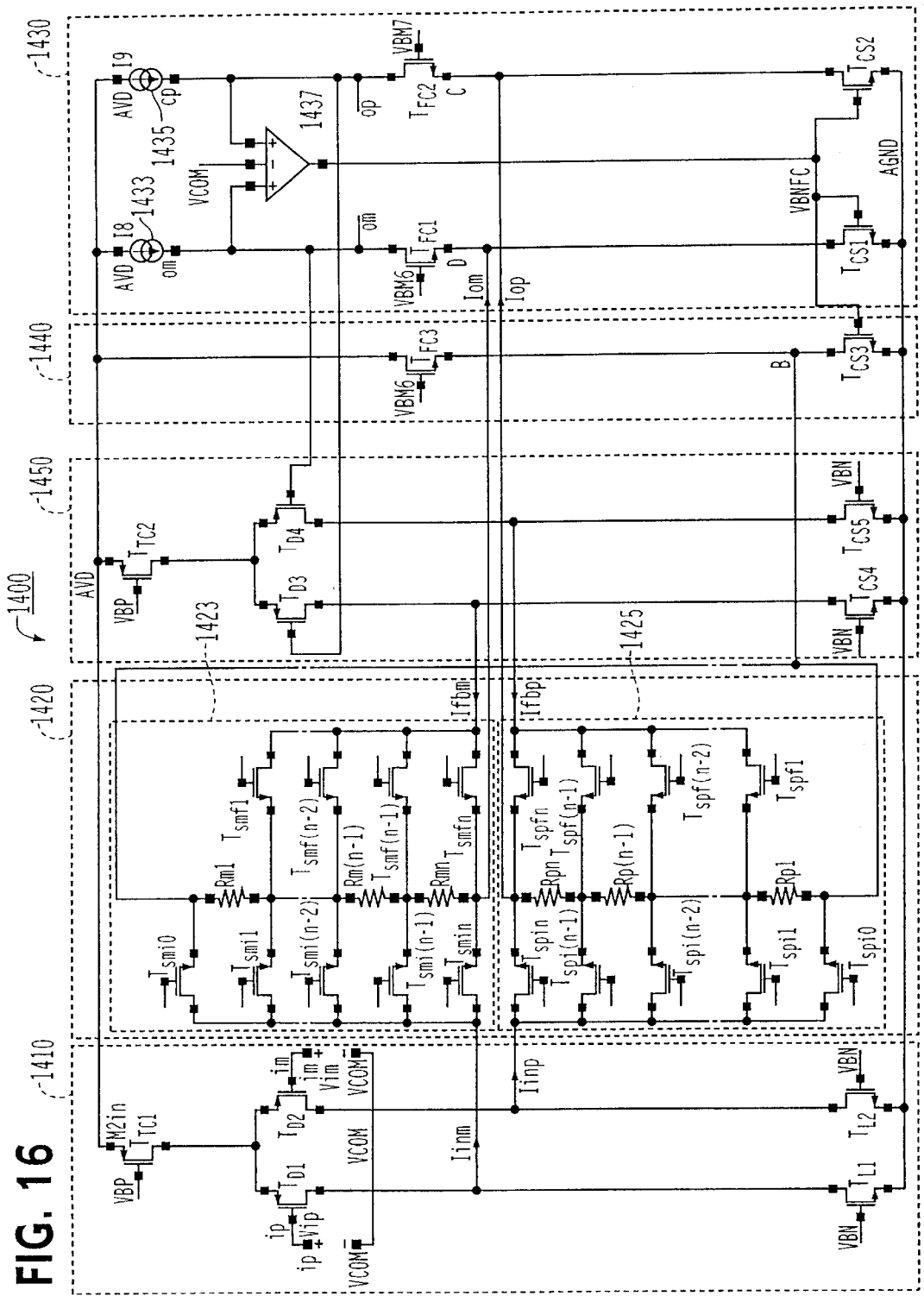
FIG. 16 is a circuit diagram of a programmable transconductor-transconductor voltage amplifier using intermediary resistive dividers for adjusting the gain, using a linear resistive network, according to the third preferred embodiment of the present invention.

FIG. 16 shows a more detailed circuit diagram of the circuit of FIG. 14. The circuit of FIG. 16 includes an input transconductor 1410, a resistive divider 1420, a current follower 1430, a voltage follower 1440, and a feedback transconductor 1450.

The input transconductor 1410 includes first and second differential transistors $T_{D1}$ and $T_{D2}$, a first tail current transistor $T_{TC1}$, and first and second load transistors $T_{L1}$ and $T_{L2}$.

The resistive divider 1420 includes an upper resistor network 1423 and a lower resistor network 1425. The upper resistor network 1423 includes first through $n^{th}$ upper resistors $R_{m1}$, $R_{m2}$, ..., $R_{mn}$, $0^{th}$ through $n^{th}$ upper input transistor switches $T_{Smi0}$, $T_{Smi1}$, ..., $T_{Smin}$, and $1^{st}$ through $n^{th}$ upper feedback transistor switches $T_{Smf1}$, $T_{Smf2}$, ..., $T_{Smfn}$. The lower resistor network 1425 includes first through $n^1$ lower resistors $R_{p1}$, $R_{p2}$, ..., $R_{pn}$, $0^{th}$ through $n^{th}$ lower input transistor switches $T_{Spi0}$, $T_{Spi1}$, ..., $T_{Spm}$, and $1^{st}$ through $n^{th}$ lower feedback transistor switches $T_{spf}$, $T_{spf2}$, ..., $T_{spfn}$.

Depending upon which of the upper input transistor switches $T_{Smi0}$, $T_{Smi1}$, ..., $T_{Smin}$, are activated, an upper input current $i_{inm}$ improvided to the upper resistor network 1423 at one of a plurality of upper taps formed between the first through $n^{th}$ upper resistors $R_{m1}$, $R_{m2}$, ..., and depending upon which of the upper feedback transistor switches $T_{Smf1}$, $T_{mf2}$, ..., $T_{Smfn}$, are activated, an upper feedback current $i_{fbm}$ is provided to the upper resistor network 1423 at one of the plurality of upper taps formed between the first through $n^{th}$ upper resistors $R_{m1}$, $R_{m2}$, ..., $R_{mn}$.

Similarly, depending upon which of the lower input transistor switches $T_{spi0}$, $T_{spi1}$, ..., $T_{spin}$, are activated, a lower input current $i_{inp}$ is provided to the lower resistor network 1425 at one of a plurality of lower taps formed between the first through $n^{th}$ lower resistors $R_{p1}$, $R_{p2}$, ..., $R_{pn}$, and depending upon which of the lower feedback transistor switches $T_{spf1}$, $T_{spf2}$, ..., $T_{spfn}$, are activated, a lower feedback current $i_{fbp}$ is provided to the lower resistor network 1425 at one of the plurality of lower taps formed between the first through $n^{th}$ upper resistors $R_{p1}$, $R_{p2}$, ..., $R_{pn}$.

The current follower 1430 includes the first and second folded-cascode transistors $T_{FC1}$ and $T_{FC2}$, and first and second current source transistors $T_{CS1}$ and $T_{CS2}$, connected as a differential folded-cascode with current source loads 1433 and 1425. The common-mode is set by a feedback loop including the subtracter/amplifier 1437.

The voltage follower 1440 includes a third folded-cascode transistor $T_{FC3}$ and a third current source transistor $T_{CS3}$. The third folded-cascode transistor $T_{FC3}$ and the third current source transistor $T_{CS3}$ are preferably twice the size of the first folded-cascode transistor $T_{FC1}$ and a first current source transistor $T_{cs1}$, respectively. The voltage follower 1040 acts as a bias for the ends of the resistor chains $R_{m1}$, $R_{m2}$, ..., $R_{mn}$, and $R_{p1}$, $R_{p2}$, ..., $R_{pn}$, which are connected to the voltage follower at point B.

The feedback transconductor 1450 includes third and fourth differential transistors $T_{D3}$ and $T_{D3}$, a second tail current transistor $T_{TC2}$ and fourth and fifth current source transistors $T_{CS4}$, and $T_{CS5}$. The feedback transconductor 1450 closes the loop around the folded-cascode stage 1430.

Preferably bias voltages $V_{BP}$, $V_{BN}$ are generated by a special circuit that establishes the same DC currents through the first differential transistor $T_{D1}$ and the first load transistor $T_1$ as well as through the second differential transistor $T_{D2}$ and the second load transistor $T_{L2}$. This way, the net DC component of each of the output currents $i_{inp}$, $i_{inm}$ of the input transconductor 1410 is zero. Similarly, the bias voltages allow the same DC currents to flow through $T_{D3}$ and $T_{CS4}$ as well as through $T_{D4}$ and $T_{CS5}$. As a result the net DC component of each of the output currents $i_{fbp}$, $i_{fbm}$, of the feedback transconductor 1450 is also zero.

In order to lower the input impedance and to increase the output impedance of the folded-cascode 1430, gain-enhancement can be applied to the first and second folded-cascode transistors $T_{FC1}$ and $T_{FC2}$.

Figure 17:
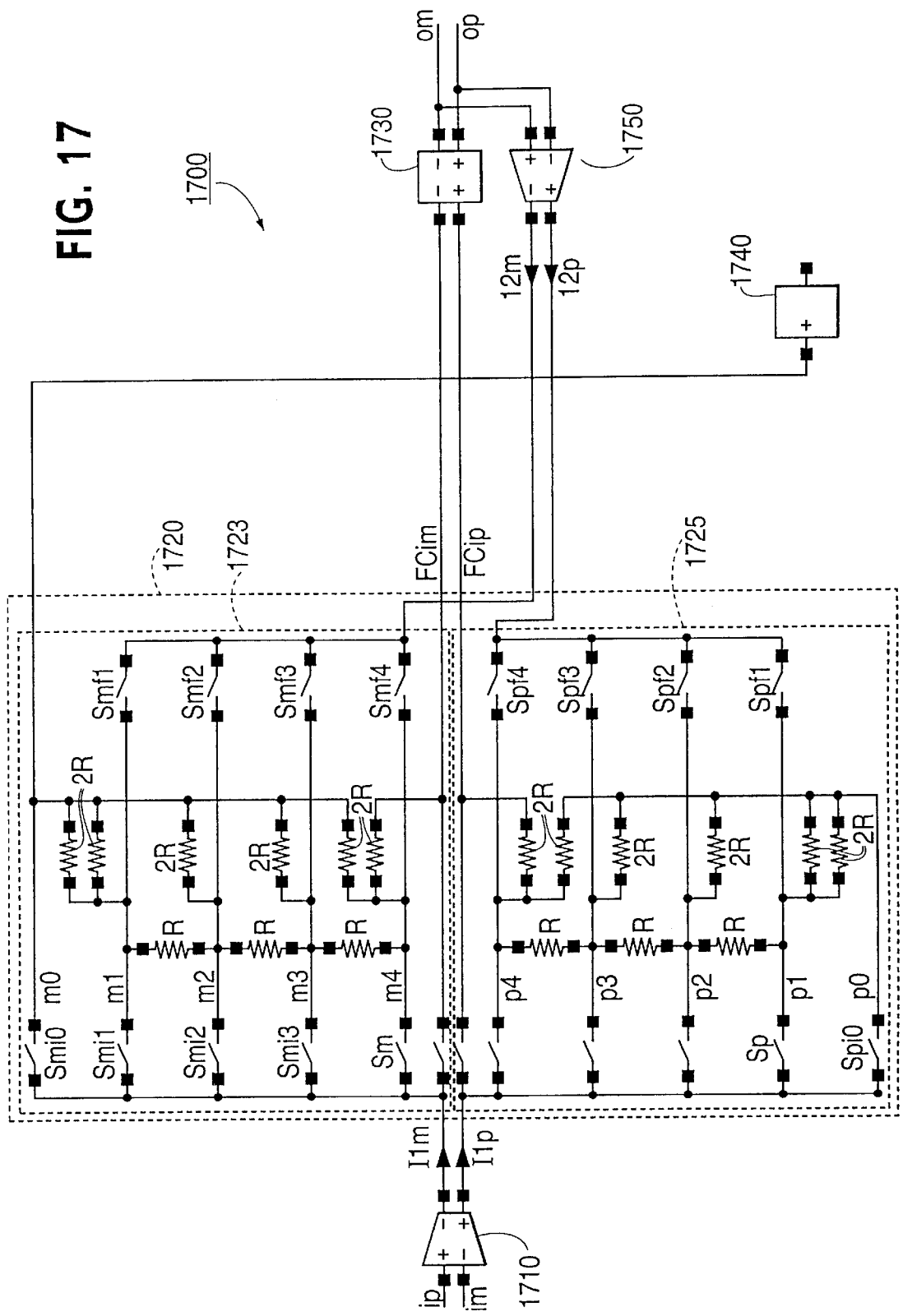
FIG. 17 is a circuit diagram of a transconductor-transconductor voltage amplifier using intermediary resistive dividers for adjusting the gain, using a R-2R resistive network, according to the third preferred embodiment of the present invention.

FIG. 17 shows a transconductor-transconductor voltage amplifier according to the third preferred embodiment of the present invention. The embodiment shown in FIG. 17 is similar to that shown in FIG. 15, except that it uses an R-kR network. In particular, FIG. 17 shows a programmable gain amplifier 1700 with a resistive divider 1720 having upper and lower four-node R-2R resistive networks 1723 and 1725. In this circuit, the possible gain values are:

$$\left\{0, \frac{1}{8}, \frac{1}{4}, \frac{1}{2}, 1, 2, 4, 8\right\} \cup \left\{\frac{1}{24}, \frac{1}{12}, \frac{1}{6}, \frac{1}{3}, 1, 3, 6, 12, 24\right\}$$

The resistive divider 1720 includes two extra switches to account for the situation where it is desirable to provide zero gain.

Figure 18:
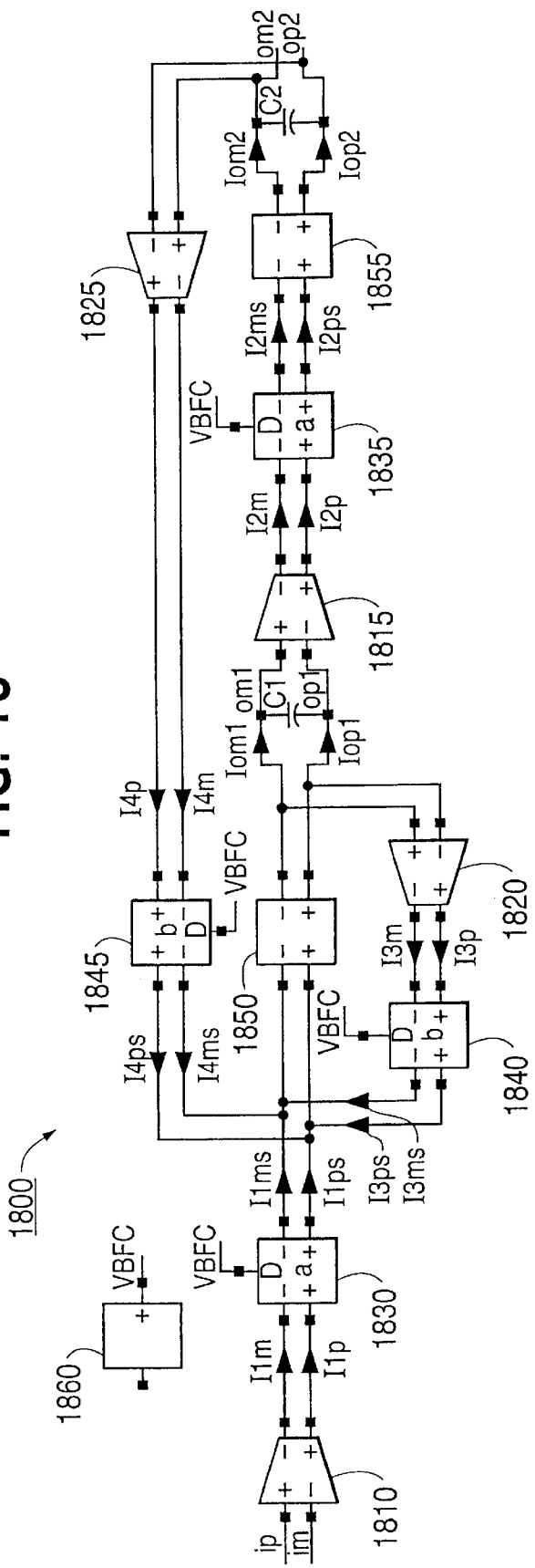
FIG. 18 is a circuit diagram of a cascode/folded-cascode $G_m$-C based biquad filter using resistive dividers to set the filter characteristics, according to a fourth preferred embodiment of the present invention.

FIG. 18 discloses a cascode/folded-cascode $G_m$-C based biquad filter 1800 including two feedback transconductors, according to a fourth preferred embodiment of the present invention. In particular, the circuit of FIG. 18 includes first and second input transconductors 1810 and 1815, first and second feedback transconductors 1820 and 1825, first and second input resistive dividers 1830, 1835, first and second feedback resistive dividers 1840 and 18 first and second current followers 185 nd 1855, a bias circuit 1860, and first and second capacitors $C_1$ and $C_2$.

The current followers 1850 and 1855 are preferably folded-cascodes, and the bias circuit 1860 is preferably a dummy folded-cascode. The bias circuit 1860 generates a DC voltage equal to the input DC voltage of the current-followers 1850 and 1855. The input resistance of the bias circuit 1860 is preferably substantially equal to half the input resistance of the individual branches of current-followers 1850 and 1855.

Preferably, the input transconductors 1810 and 1815 and the feedback transconductors 1820 and 1825 are biased in such a way as to have zero DC output currents. This is done so that there will be no DC current flowing through any of the resistive dividers 1830, 1835, 1840, and 1845.

The first scaled input currents (i.e., $i_{1ms}$ and $i_{1ps}$), which are provided from the first input resistive divider 1830, and the scaled feedback currents ($i_{3ms}$ and $i_{3ps}$, and $i_{4ms}$ and $i_{4ps}$), which are provided from the first and second feedback resistive dividers 1840 and 1845, respectively, are summed at the low impedance inputs of the first current-follower 1850, which then provides the output currents $i_{om1}$ and $i_{op1}$ to the second input transconductor 1815. The second scaled input currents (i.e., $i_{2ms}$ and $i_{2ps}$) output from the second resistive divider 1835 are then provided to the low impedance inputs of the second current-follower 1855.

The input and feedback current dividers 1830, 1835, 1840, and 1845 can be programmable, as described above with reference to FIGS. 12 and 13. The current dividers may be formed linear chain current dividers, R-kR current dividers, or any other suitable current dividers.

The parameters of the filter of FIG. 18 can be expressed as functions of a single transconductance $g_m$. Even though there are four transconductors used, each can be referred to has having a transconductance $g_{mk}$ that is a multiple of a base transconductance $g_m$:

$$g_{mk} = a_k \times g_m, \; k = 1, \ldots, 4 \tag{37}$$

where $a_k$ is a constant for each transconductor.

Based on this relationship, the parameters of the filter become:

$$\omega_0 = \sqrt{a_2 \times a_4} \times \frac{g_m}{\sqrt{C_1 \times C_2}} \quad (38)$$

$$Q = \sqrt{\frac{a_2 \times a_4}{a_3^2}} \times \sqrt{\frac{C_1}{C_2}} \quad (39)$$

$$T_2(0) = \frac{a_1}{a_4} \quad (40)$$

where $\omega_0$ is the cut-off frequency, Q is the quality factor, and $T_2(0)$ is the DC gain.

The filter of FIG. 18 can use only a reduced numbers of values of transconductance (e.g. $g_m$=max $\{g_{m1}, g_{m2}, g_{m3}, g_{m4},\}$) and current dividers of appropriate values at the output of the transconductors.

The currents $i_{1ps}, i_{1ms}, i_{2ps}, i_{2ms}, i_{3ps}, i_{3ms}, i_{4ps}$, and $i_{4ms}$ are scaled values of the currents $i_{1p}, i_{1m}, i_{2p}, i_{2m}, i_{3p}, i_{3m}, i_{4p}$, and $i_{4m}$, respectively.

Figure 19:
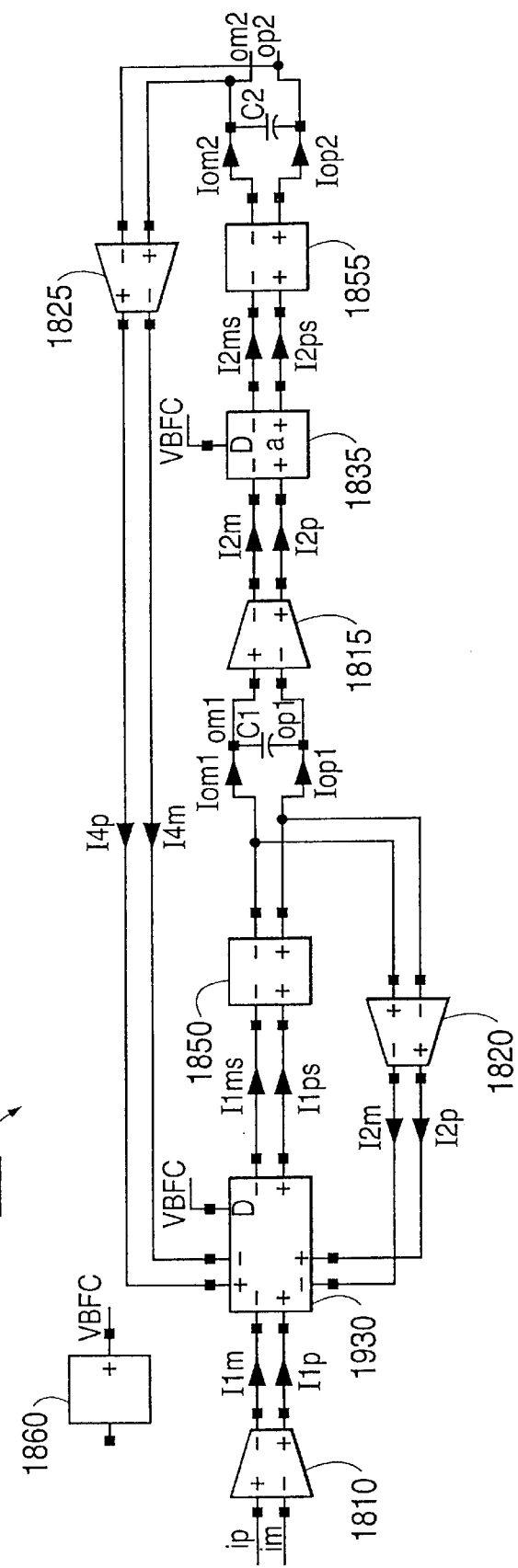
FIG. 19 is a circuit diagram of a cascode/folded-cascode $G_m$-C based biquad filter using one resistive divider per current follower to set the filter characteristics, according to a fifth preferred embodiment of the present invention.

FIG. 19 shows a fifth preferred embodiment of the present invention. In this embodiment, the transconductors feeding the same current follower (i.e., the first input transconductor 1810 and the first and second feedback transconductors 1820 and 1825, in this embodiment) can share a single first input current divider 1930. In this case, the transconductors 1810, 1820, and 1825 use different switches, as shown, for example in the programmable gain amplifier described with reference to FIG. 15.

Figure 20:
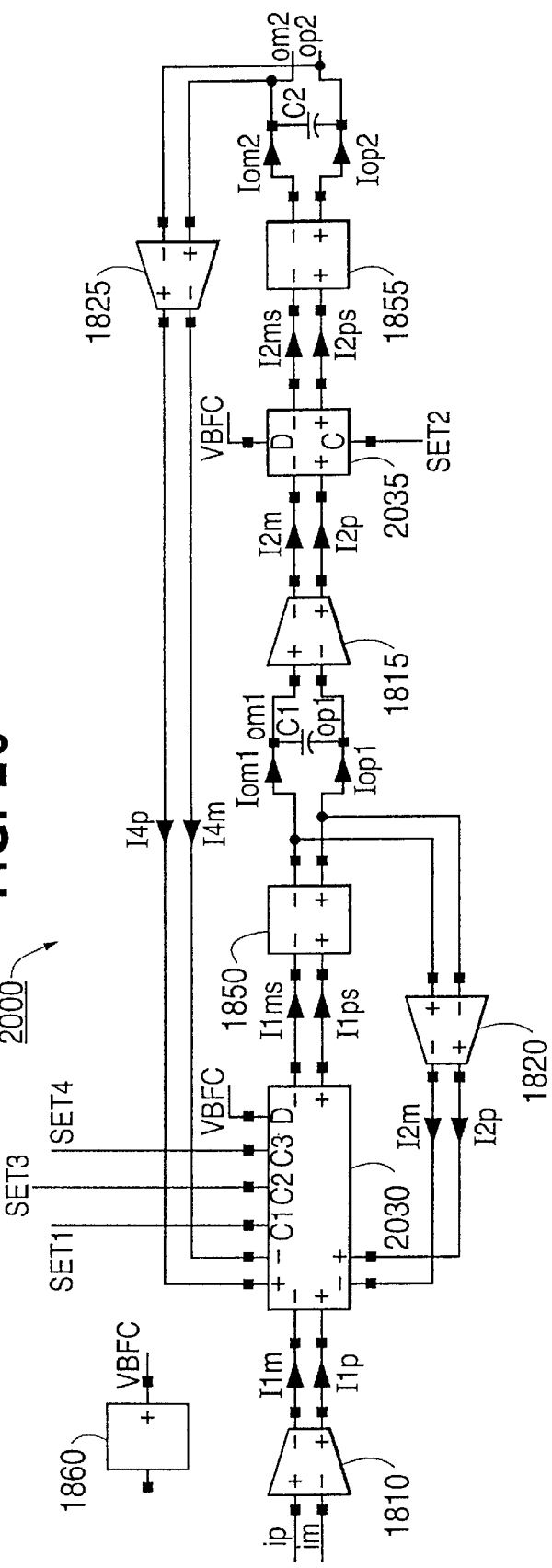
FIG. 20 is a circuit diagram of a cascode/folded-cascode $G_m$-C based biquad filter using one programmable resistive divider per current follower to set the filter characteristics, according to a sixth preferred embodiment of the present invention.

FIG. 20 shows a sixth preferred embodiment of the present invention. In this embodiment, the transconductors feeding the same current follower (i.e., the first input transconductor 1810 and the first and second feedback transconductors 1820 and 1825, in this embodiment) can share a single programmable first input current divider 2030, similar to the circuit shown in FIG. 14. Likewise, a programmable second input resistive divider 2035 is provided between the input transconductors 1815 and the second current-follower 1855. The filter structure presented above can have a double function of filter and programmable gain amplifier.

Figure 21:
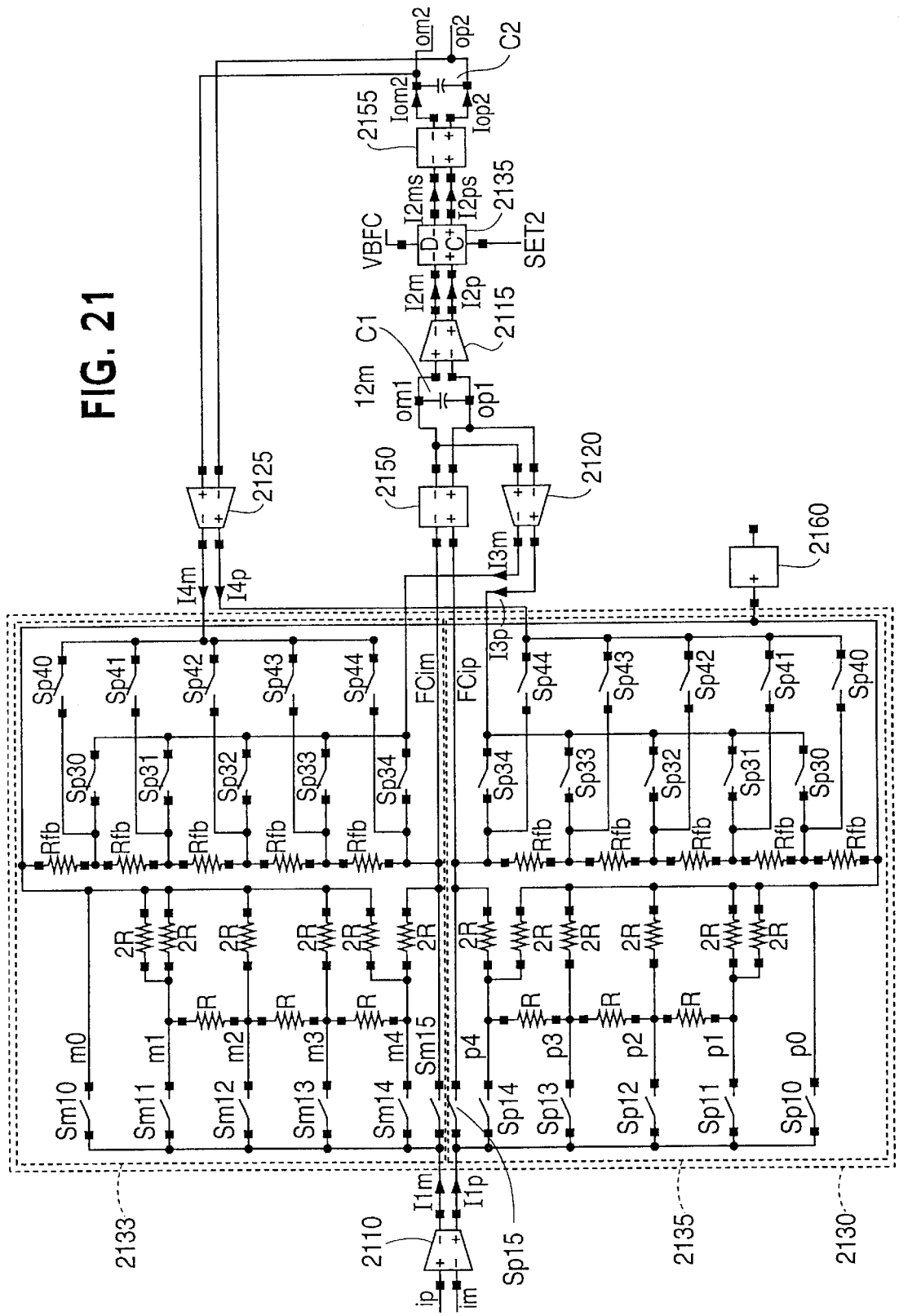
FIG. 21 is a circuit diagram of an input stage for a merged programmable gain amplifier and a cascode/folded-cascode $G_m$-C based biquad filter using exponential control for the gain and linear control for the filter characteristics, according to the sixth preferred embodiment of the present invention.

By programming the value of the transconductance gm1 the gain of the DC gain T(0) of the filter will follow. FIG. 21 is a block diagram of a seventh preferred embodiment of the present invention. In this embodiment, a filter is provided with linear control of the cut-off frequency and quality factor and exponential control of the gain.

As shown in FIG. 21, the filter 2100 includes first and second input transconductors 2110 and 2115, first and second feedback transconductors 2120 and 2125, first and second input resistive dividers 2130, 2135, first and second feedback resistive dividers 2140 and 2145, first and second current followers 2150 and 2155, a bias circuit 2160, and first and second capacitors $C_1$ and $C_2$.

The currents $i_{1p}$ and $i_{1m}$ provided by the first input transconductor 2110 are scaled by two R-2R networks 2133 and 2135 in the first resistive divider 2130, under the control of the switches $Sp_{10}, Sp_{11}, \ldots, Sp_{15}; S_{m10}, S_{m11}, \ldots, S_{m15}$. The gain T(0) is proportional to the equivalent transconductance of $G_{Min}$ and the R-2R current divider.

The feedback currents $i_{3p}, i_{3m}, i_{4p}, i_{4m}$, are scaled by two linear resistor chains ($R_{fb}$) under the control of the switches $S_{p30}, S_{p31}, \ldots, S_{p34}; S_{m30}, S_{m31}, \ldots, S_{m34}$, for the first feedback transconductor 2120 and the switches $S_{p40}, S_{p41}, \ldots, S_{p44}; S_{m40}, S_{m41}, \ldots, S_{m44}$, the second feedback transconductor 2125.

The implementation of very large time constants using $G_m$-C structures requires either very large capacitors or very small transconductances. It is possible to realize such low values for the transconductance by using very weak MOS transistors (e.g., having small W/L ratios) and/or very small bias currents. Unfortunately, small $g_m$ transistors occupy a large space on the chip, and very small bias currents are difficult to control. The usual methods of realizing very low transconductances employ the so called "current cancellation technique using partial positive feedback" or source degeneration differential pairs with an extra differential pair for current division.

The above presented technique of programming the transconductance through the use of resistive current dividers enables the realizations of very small transconductances by using conventional-sized transconductors. This method is especially useful when implementing many continuous-time filters on the same chip with a large spread of cut-off frequencies. In that case, it is useful to use the same unit transconductor with different resistive dividers. The tuning of the filters can thus be unified and the layout effort is greatly reduced.

Figure 22:
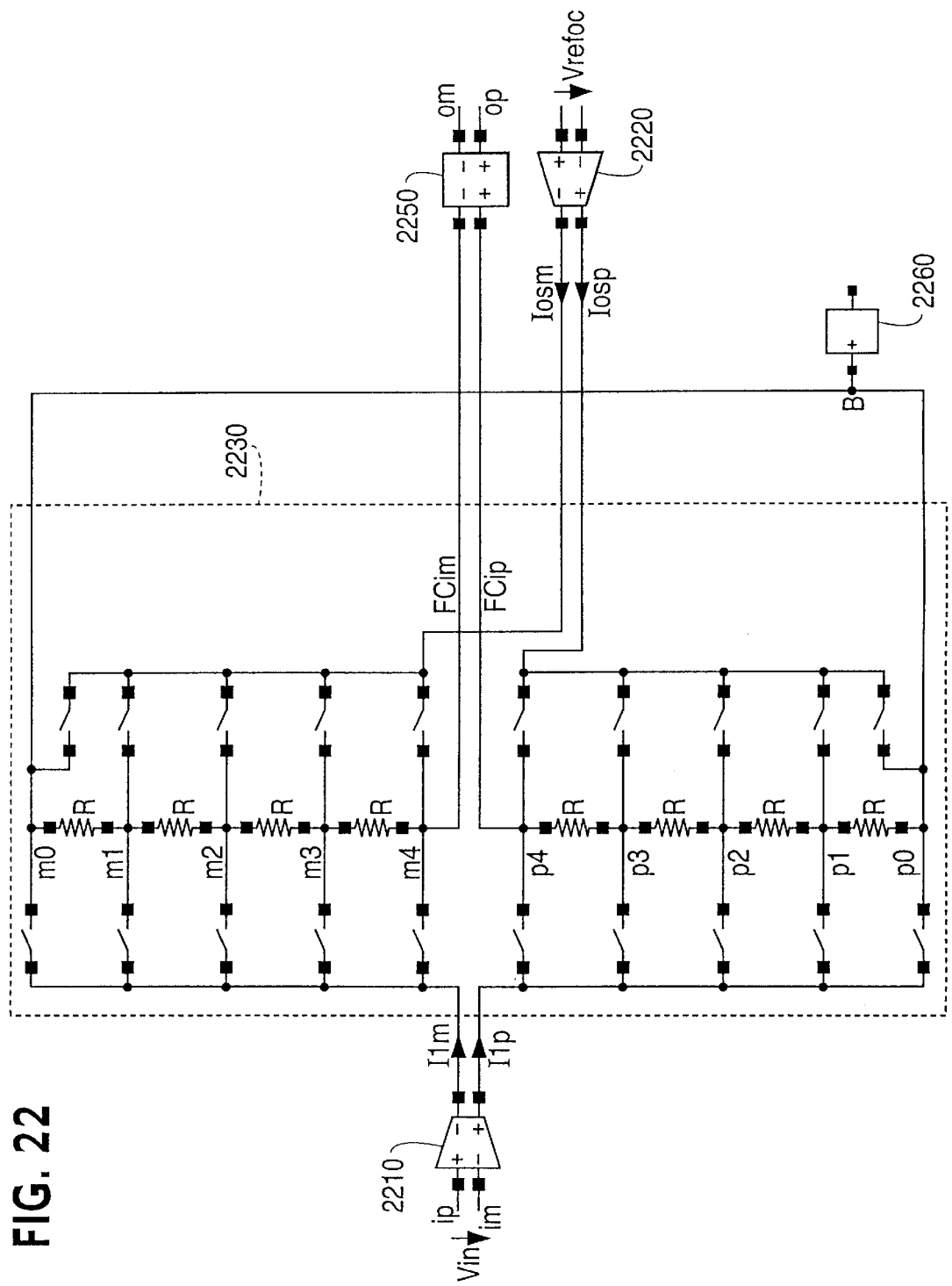
FIG. 22 is a circuit diagram of an offset compensation technique for a resistive divider based cascode/folded-cascode $G_m$-C biquad filter, according to a seventh preferred embodiment of the present invention.

The basic structure of the programmable amplifier/filter presented above can easily include a mechanism for offset compensation in discrete steps. FIG. 22 shows such a structure for a programmable transconductor only, according to a seventh preferred embodiment of the present invention.

Fixed currents $i_{osp}, i_{osm}$ coming out of the second input transconductor 2220 with a fixed DC input voltage $V_{refoc}$ are injected into selected taps of the resistive current divider 2230. The resistive current divider 2230 may be the main gain setting network or a separate one, with a different resolution. The scaled offset compensation currents add to the scaled output currents of the first transconductor 2210 in order to compensate for the DC offset present in the system.

The selection of the taps is made by appropriate offset compensation control circuitry. In the embodiment shown in FIG. 22, an offset correction current is injected into the gain setting nodes of the resistive divider network 2230 through separated switches.

The programming technique presented above can be used in any filter configuration using transconductors, current summers, and capacitors. In addition, the same technique illustrated here for a CMOS technology can be equally applied to BiCMOS or bipolar filters.

The present invention has been described by way of a specific exemplary embodiment, and the many features and advantages of the present invention are apparent from the written description. Thus, it is intended that the append claims cover all such features and advantages of the invention. Further, since numerous modifications and changes will readily occur to those skilled in the art, it is not desired to limit the invention to the exact construction and operation ad illustrated and described. Hence, all suitable modifications and equivalents may be resorted to as falling within the scope of the invention.

What is claimed is:

1. An amplifier, comprising:
   an input voltage-to-current converter for receiving an input voltage and providing upper and lower input currents;
   an input current divider for receiving a first bias voltage and the upper and lower input currents, scaling the upper and lower input currents, and providing upper and lower scaled input currents;
   a current follower for receiving the upper and lower scaled input currents, and for providing upper and lower output currents and an output voltage;
   a feedback voltage-to-current converter for receiving the output voltage and providing upper and lower feedback currents; and a feedback current divider for receiving a second bias voltage and the upper and lower feedback currents, scaling the upper and lower feedback currents, and providing upper and lower scaled feedback currents to the current follower.

2. An amplifier, as recited in claim 1, further comprising a voltage follower for providing the first and second bias voltages.

3. An amplifier, as recited in claim 2, wherein the first and second bias voltages are substantially the same, and are equal to a current follower DC input voltage.

4. An amplifier, as recited in claim 1, wherein the input current divider is programmable.

5. An amplifier, as recited in claim 1, wherein the feedback current divider is programmable.

6. A filter, comprising:

a first input voltage-to-current converter for receiving an input voltage and providing upper and lower first input currents;

a first input current divider for receiving a first bias voltages, the upper and lower first input currents, scaling the upper and lower first input currents, and providing upper and lower first scaled input currents;

a first current follower for receiving the upper and lower first scaled input currents, and for providing upper and lower first output currents and upper and lower first output voltages;

a first capacitor connected between the upper and lower first output voltages;

a second input voltage-to-current converter for receiving the upper and lower first output voltages and providing upper and lower second input currents;

a second input current divider for receiving a second bias voltage and the upper and lower second input currents, scaling the upper and lower second input currents, and providing upper and lower second scaled input currents;

a second current follower for receiving the upper and lower second scaled input currents, and for providing upper and lower second output currents and a upper and lower second output voltage;

a second capacitor connected between the upper and lower second output voltages;

a first feedback voltage-to-current converter for receiving the upper and lower first output voltages and providing upper and lower first feedback currents;

a first feedback current divider for receiving a third bias voltage and the upper and lower first feedback currents, scaling the upper and lower first feedback currents, and providing upper and lower first scaled feedback currents to the first current follower;

a second feedback voltage-to-current converter for receiving the upper and lower second output voltages and providing upper and lower second feedback currents; and a second feedback current divider for receiving a fourth bias voltage and the upper and lower second feedback currents, scaling the upper and lower second feedback currents, and providing upper and lower second scaled feedback currents to the first current follower.

* * * * *